US008605511B2

(12) United States Patent
Tanaka et al.

(10) Patent No.: US 8,605,511 B2
(45) Date of Patent: *Dec. 10, 2013

(54) NON-VOLATILE SEMICONDUCTOR MEMORY DEVICE ADAPTED TO STORE A MULTI-VALUED DATA IN A SINGLE MEMORY CELL

(75) Inventors: Tomoharu Tanaka, Yokohama (JP); Jian Chen, San Jose, CA (US)

(73) Assignees: Kabushiki Kaisha Toshiba, Tokyo (JP); SanDisk Corporation, Sunnyvale, CA (US)

( * ) Notice: Subject to any disclaimer, the term of this patent is extended or adjusted under 35 U.S.C. 154(b) by 0 days.
This patent is subject to a terminal disclaimer.

(21) Appl. No.: 13/482,577

(22) Filed: May 29, 2012

(65) Prior Publication Data
US 2012/0236657 A1  Sep. 20, 2012

Related U.S. Application Data

(60) Continuation of application No. 12/967,227, filed on Dec. 14, 2010, now Pat. No. 8,208,311, which is a continuation of application No. 12/652,418, filed on Jan. 5, 2010, now Pat. No. 7,864,591, which is a continuation of application No. 12/168,283, filed on Jul. 7, 2008, now Pat. No. 7,672,168, which is a continuation of application No. 11/871,441, filed on Oct. 12, 2007, now Pat. No. 7,405,970, which is a continuation of application No. 11/417,185, filed on May 4, 2006, now Pat. No. 7,286,404, which is a continuation of application No. 11/049,535, filed on Feb. 3, 2005, now Pat. No. 7,088,616, which is a division of application No. 10/656,139, filed on Sep. 8, 2003, now Pat. No. 6,990,019, which is a division of application No. 10/051,372, filed on Jan. 22, 2002, now Pat. No. 6,643,188.

(30) Foreign Application Priority Data

Jan. 27, 2001 (JP) ................................. 2001-397446

(51) Int. Cl.
*G11C 16/04* (2006.01)

(52) U.S. Cl.
USPC .................................. 365/185.22; 365/185.24

(58) Field of Classification Search
USPC .............. 365/185.22, 185.24, 185.28, 185.33
See application file for complete search history.

(56) References Cited

U.S. PATENT DOCUMENTS 4,827,451 A   5/1989  Marquot et al.
5,157,262 A  10/1992  Marsoner et al.
(Continued)

FOREIGN PATENT DOCUMENTS

EP   0673037 A1   3/1995
EP   0899744 A2   3/1999
(Continued)

OTHER PUBLICATIONS

Korean Office Action dated Mar. 27, 2004 in Application No. 2000-035375.

(Continued)

*Primary Examiner* — Vu Le
(74) *Attorney, Agent, or Firm* — Banner & Witcoff, Ltd.

(57) ABSTRACT

A non-volatile semiconductor memory device includes an electrically data rewritable non-volatile semiconductor memory cell and a write circuit for writing data in the memory cell, the write circuit writing a data in the memory cells by supplying a write voltage Vpgm and a write control voltage VBL to the memory cell, continuing the writing of the data in the memory cell by changing the value of the write control voltage VBL in response to an advent of a first write state of the memory cell and inhibiting any operation of writing a data to the memory cell by further changing the value of the write control voltage VBL to Vdd in response to an advent of a second write state of the memory cell.

28 Claims, 15 Drawing Sheets

(56) References Cited

U.S. PATENT DOCUMENTS

| | | |
|---|---|---|
| 5,172,338 A | 12/1992 | Mehrotra |
| 5,465,235 A | 11/1995 | Miyamoto |
| 5,515,324 A | 5/1996 | Tanaka |
| 5,555,204 A | 9/1996 | Endoh et al. |
| 5,570,315 A | 10/1996 | Tanaka et al. |
| 5,572,462 A | 11/1996 | Lee |
| 5,615,165 A | 3/1997 | Tanaka et al. |
| 5,638,320 A | 6/1997 | Wong et al. |
| 5,652,719 A | 7/1997 | Tanaka et al. |
| 5,682,346 A | 10/1997 | Yamamura et al. |
| 5,691,941 A | 11/1997 | Imamiya et al. |
| 5,751,634 A | 5/1998 | Itoh |
| 5,768,190 A | 6/1998 | Tanaka et al. |
| 5,774,397 A | 6/1998 | Endoh et al. |
| 5,844,841 A | 12/1998 | Takeuchi et al. |
| 5,917,756 A | 6/1999 | Imamiya et al. |
| 5,946,231 A | 8/1999 | Endoh et al. |
| 5,986,929 A | 11/1999 | Sugiura et al. |
| 6,005,805 A | 12/1999 | Takeuchi |
| 6,014,330 A | 1/2000 | Endoh et al. |
| 6,046,935 A | 4/2000 | Takeuchi et al. |
| 6,055,181 A | 4/2000 | Tanaka et al. |
| 6,064,591 A | 5/2000 | Takeuchi et al. |
| 6,069,823 A | 5/2000 | Takeuchi et al. |
| 6,094,374 A | 7/2000 | Sudo |
| 6,125,052 A | 9/2000 | Tanaka |
| 6,134,140 A | 10/2000 | Tanaka et al. |
| 6,134,148 A | 10/2000 | Kawahara et al. |
| 6,178,115 B1 | 1/2001 | Shibata et al. |
| 6,188,611 B1 | 2/2001 | Endoh et al. |
| 6,195,287 B1 | 2/2001 | Hirano |
| 6,208,560 B1 | 3/2001 | Tanaka et al. |
| 6,285,597 B2 | 9/2001 | Kawahara et al. |
| 6,288,935 B1 | 9/2001 | Shibata et al. |
| 6,307,785 B1 | 10/2001 | Takeuchi et al. |
| 6,363,010 B2 | 3/2002 | Tanaka et al. |
| 6,377,485 B1 | 4/2002 | Shibata et al. |
| 6,411,551 B1 | 6/2002 | Kim et al. |
| 6,473,338 B2 | 10/2002 | Sugimura |
| 6,487,122 B2 | 11/2002 | Shibata et al. |
| 6,496,418 B2 | 12/2002 | Kawahara et al. |
| 6,522,580 B2 | 2/2003 | Chen et al. |
| 6,545,909 B2 | 4/2003 | Tanaka et al. |
| 6,643,188 B2 | 11/2003 | Tanaka et al. |
| 6,657,891 B1 | 12/2003 | Shibata et al. |
| 6,683,810 B2 | 1/2004 | Sakamoto |
| 6,744,670 B2 | 6/2004 | Tamada et al. |
| 6,798,697 B2 | 9/2004 | Hosono et al. |
| 6,819,590 B2 | 11/2004 | Goda et al. |
| 6,831,858 B2 | 12/2004 | Hirano et al. |
| 6,850,435 B2 | 2/2005 | Tanaka |
| 6,876,578 B2 | 4/2005 | Shibata et al. |
| 6,922,364 B2 | 7/2005 | Kojima |
| 6,982,904 B2 | 1/2006 | Shiga |
| 6,990,019 B2 | 1/2006 | Tanaka et al. |
| 7,088,616 B2 | 8/2006 | Tanaka et al. |
| 7,139,192 B1 | 11/2006 | Wong |
| 7,224,615 B2 | 5/2007 | Tanaka |
| 7,286,404 B2 | 10/2007 | Tanaka et al. |
| 7,301,806 B2 | 11/2007 | Tanaka |
| 7,405,970 B2 | 7/2008 | Tanaka et al. |
| 7,672,168 B2 | 3/2010 | Tanaka et al. |
| 7,864,591 B2 | 1/2011 | Tanaka et al. |
| 2003/0053356 A1 | 3/2003 | Sakamoto |
| 2004/0047183 A1 | 3/2004 | Tanaka et al. |

FOREIGN PATENT DOCUMENTS

| | | |
|---|---|---|
| FR | 2800503 A1 | 5/2001 |
| JP | 3414587 | 12/1997 |
| JP | 09326199 | 12/1997 |
| JP | 10-228786 | 8/1998 |
| JP | 11219593 | 8/1999 |
| JP | 2000149578 | 5/2000 |
| JP | 2000163977 | 6/2000 |
| JP | 2001-167589 | 6/2001 |
| JP | 2001266583 | 9/2001 |
| JP | 2003-196988 | 7/2003 |
| KR | 2000-0035375 | 6/2000 |
| KR | 2001-0044902 | 6/2001 |

OTHER PUBLICATIONS

Chinese Office Action dated Jun. 3, 2005 in Application No. 02106452.0.
European Search Report dated Jul. 20, 2005 in Application No. EP 05001104.5.
Japanese Office Action dated Jun. 29, 2004 in Application No. JP 2001-397446.
Hemink, G J. et al., Symposium on VLSI Technology Digest of Technical Papers, pp. 129-130, "Fast and Accurate Programming Method for Multi-Level Nand EEPROMS", 1995.
U.S. Appl. No. 10/656,139, filed Sep. 8, 2003, Tanaka et al.

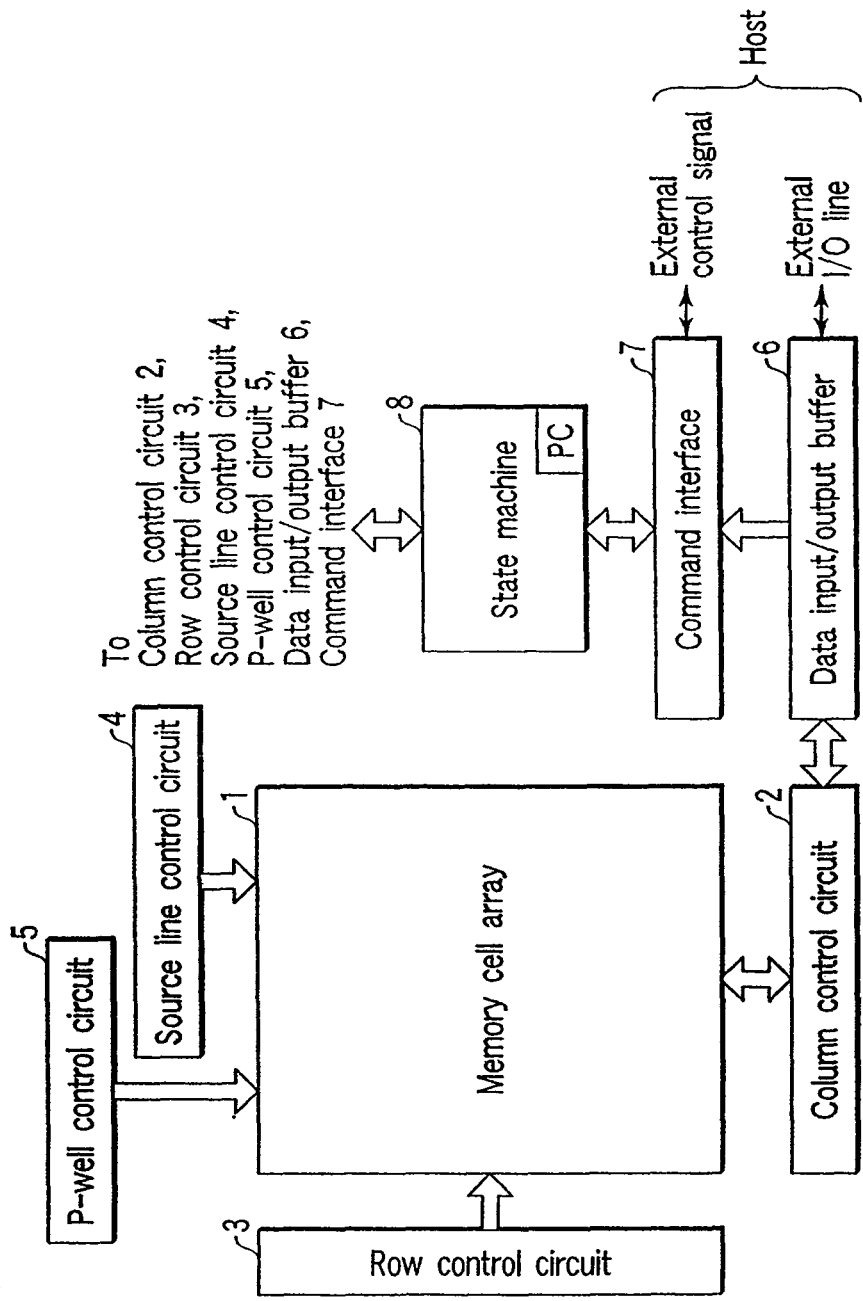
F I G. 2

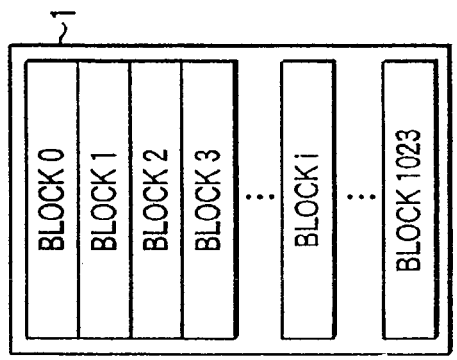
F I G. 3A
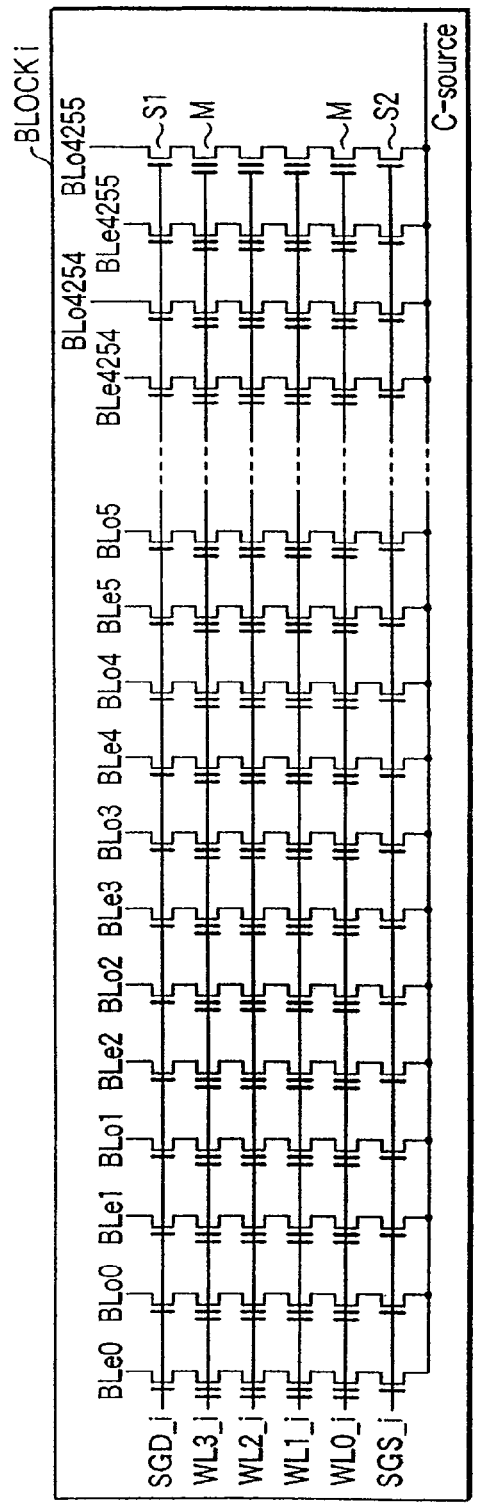
F I G. 3B

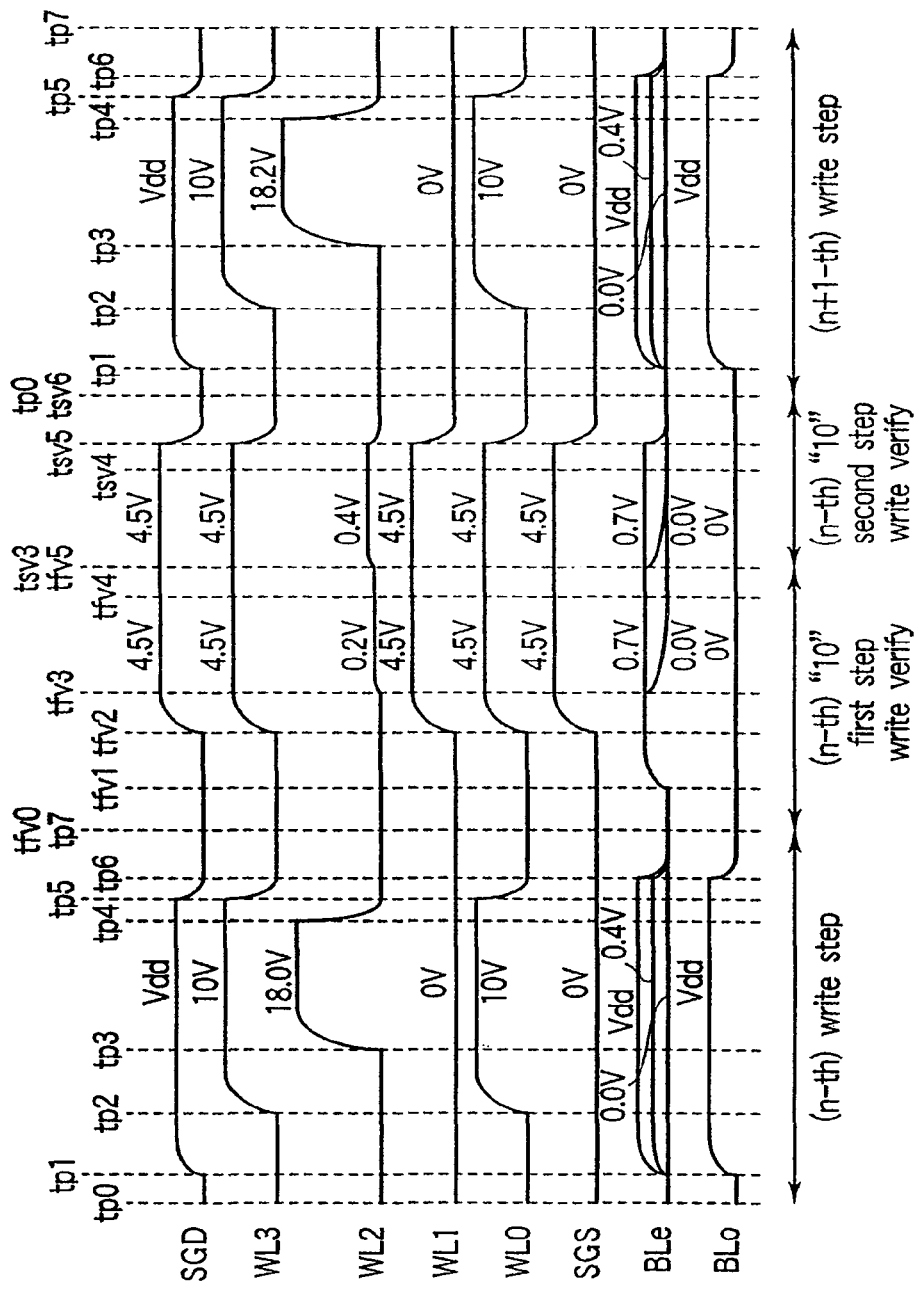
F I G. 18

NON-VOLATILE SEMICONDUCTOR MEMORY DEVICE ADAPTED TO STORE A MULTI-VALUED DATA IN A SINGLE MEMORY CELL

CROSS-REFERENCE TO RELATED APPLICATIONS

This application is a Continuation of U.S. application Ser. No. 12/967,227, filed Dec. 14, 2010, which is a Continuation of U.S. application Ser. No. 12/652,418, filed Jan. 5, 2010, now U.S. Pat. No. 7,864,591, which is a Continuation of U.S. application Ser. No. 12/168,283, filed Jul. 7, 2008, now U.S. Pat. No. 7,672,168, which is a Continuation of U.S. application Ser. No. 11/871,441, filed Oct. 12, 2007, now U.S. Pat. No. 7,405,970, which is a Continuation of U.S. application Ser. No. 11/417,185, filed May 4, 2006, now U.S. Pat. No. 7,286,404, which is a Continuation of U.S. application Ser. No. 11/049,535, filed Feb. 3, 2005, now U.S. Pat. No. 7,088,616, which is a Divisional of U.S. application Ser. No. 10/656,139 filed on Sep. 8, 2003, now U.S. Pat. No. 6,990,019, which is a Divisional of U.S. application Ser. No. 10/051,372, filed Jan. 22, 2002, now U.S. Pat. No. 6,643,188, which is based upon and claims the benefit of priority from the prior Japanese Patent Application No. 2001-397446, filed Dec. 27, 2001, the entire contents of which are incorporated herein by reference in their entirety.

BACKGROUND OF THE INVENTION

1. Field of the Invention

This invention relates to an electrically data rewritable non-volatile semiconductor memory device. More particularly, it relates to a multi-value flash memory adapted to store a multi-valued data in a memory cell.

2. Description of the Related Art

In a flash memory, the accumulated electric charge of the floating gate of a memory cell transistor is changed as the stored data is erased and a new data is written there. Then, as a result, the threshold value is changed to store the data. For instance, the negative threshold value may be made to corresponds to a "1" data, whereas the positive threshold value may be made to corresponds to a "0" data.

In recent years, multi-value flash memories adapted to store a plurality of bits in a single memory cell have been developed to reduce the cost per bit and/or increase the storage capacity. In a memory device adapted to store two bits in a single memory cell, the memory cell has four threshold values depending on the data to be stored there.

A highly reliable memory device can be obtained by accurately controlling the threshold values of each memory cell. "Fast and Accurate Programming Method for Multi-level NAND EEPROMs, pp. 129-130, Digest of 1995 Symposium on VLSI Technology" proposes a method of writing data, raising the write voltage Vpgm at a rate, in order to precisely control the threshold values of each memory cell.

With the method proposed in the above cited document, the width of distribution of each threshold value can be controlled theoretically to as small as 0.2V by raising the write voltage Vpgm at a rate of 0.2V/10 μsec. Normally, the write voltage Vpgm is divided into a plurality of write pulses and the voltage Vpgm of the pulses is raised stepwise at a predetermined rate. This technique provides an effect similar to that of continuously raising the write voltage Vpgm. The threshold value is checked after applying each pulse to the memory cell and the write operation is terminated when the threshold value has got to a predetermined verification level.

Meanwhile, micronization of processing dimensions is in progress. This means that the gaps separating memory cells are made smaller and smaller to consequently give rise to various problems from the viewpoint of multi-valued flash memories. For instance, the distance separating floating gates is reduced to produce problems as pointed out below as a result of micronization.

Imagine two memory cells A and B arranged side by side. Assume that the data of the two memory cells are erased simultaneously and they are made to have a threshold value of −3V. Then, firstly a data is written into the memory cell A. As a result, its threshold value may be raised to 0.5V to 1V. Subsequently, another data that is different from the data written into the memory cell A is written into the memory cell B. As the threshold value of the memory cell B is raised to 1.5V to 2V, the electric potential of the floating gate of the memory cell A falls and its threshold value is raised, say, to 1V to 1.5V as a result of the capacitive coupling of the floating gates of the two memory cells.

In the above described instance, the difference of the threshold values of the memory cells A and B (read out margin) should be at least 0.5V. However, it is reduced to 0V as a result of the capacitive coupling of the floating gates of the two memory cells. Thus, the difference of the threshold values necessary for discriminating two different data is reduced and the read out margin disappears.

How the threshold value of a memory cell storing a data written in advance in a manner described above changes under the influence of a write operation of another memory cell will be described below by referring to FIGS. 1A through 1C of the accompanying drawing.

FIG. 1A shows the electric charge of the floating gate FG1 of a memory cell where the data stored there is erased and subsequently a new data is written. Electrons are accumulated in the floating gate FG1 of the memory cell where a data is written. In FIG. 1A, "- -" indicates electrons. Subsequently, data are written in the memory cells located respectively at the two sides of the first memory cell and having respective floating gates FG2, FG3. Then, a change occurs at the floating gate FG1 of the first memory cell as shown in FIG. 1B. The electric potential of the memory cell where a data is written first falls and its threshold value rises as shown in FIG. 1C because of the electrostatic capacitive coupling of the neighboring floating gates FG2, FG3. Then, as a result, the threshold value of the memory cell having the floating gate FG1 shows a wide distribution. In FIGS. 1A and 1B, reference symbol WL denotes the word line (control gate) arranged commonly for the memory cells having the floating gates FG1, FG2, FG3.

Thus, the technological development for reducing the distribution width of the threshold value of a memory will become increasingly important in the future in order to cope with this problem.

It may be conceivable to reduce the stepwise increment Dvpgm of the write voltage Vpgm in order to avoid this problem. For example, the distribution width of the threshold value is reduced from 0.5V to 0.1V to increase the write out margin by 0.4V by reducing the stepwise increment Dvpgm from 0.5V to 0.1V.

However, as the stepwise increment is reduced to ⅕ of the original value, the number of pulses becomes five times as many as the original number. Then, the write time will become five times as long as the original value to give rise to a new problem.

Therefore, so far, any attempt at securing a write out margin and raising the reliability of a memory device is accompanied by the problem of an increased write time.

BRIEF SUMMARY OF THE INVENTION

In an aspect of the present invention, there is provided a non-volatile semiconductor memory device comprises: an electrically data rewritable non-volatile semiconductor memory cell; and a write circuit for writing data in the memory cell, the write circuit writes a data in the memory cells by supplying a write voltage and a write control voltage to the memory cell, continues the writing of the data in the memory cell by changing the supply of the write control voltage to the memory cell in response to an advent of a first write state of the memory cell and inhibits any operation of writing a data to the memory cell by further changing the supply of the write control voltage to the memory cell in response to an advent of a second write state of the memory cell.

BRIEF DESCRIPTION OF THE SEVERAL VIEWS OF THE DRAWING

FIG. 2 is a schematic block diagram of the first embodiment of flash memory according to the invention, illustrating its overall configuration;

FIG. 3A is a schematic block diagram illustrating the internal configuration of the memory cell array in FIG. 2;

FIG. 3B is a circuit diagram of a NAND-type memory unit arranged in each of the blocks of FIG. 3A;

FIG. 18 is a graph illustrating the signal waveforms of different parts of the third embodiment of flash memory according to the invention when writing a data into a single memory cell.

DETAILED DESCRIPTION OF THE INVENTION

Figure 1A:
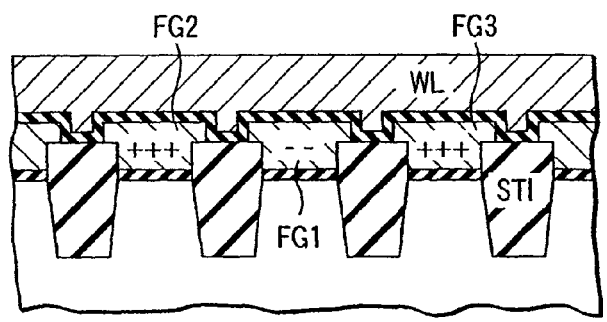
FIGS. 1A through 1C are schematic illustrations of the sectional view and distribution of a threshold value referred to for pointing out the problem of the prior art.
Figure 1B:
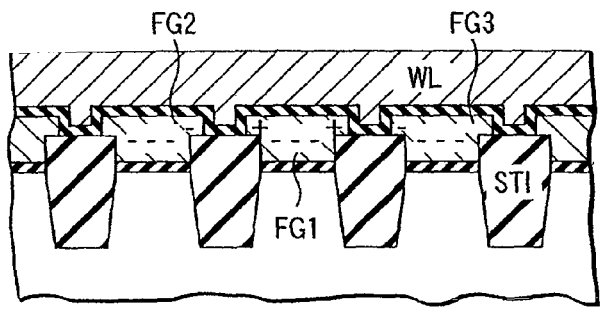
Figure 1C:
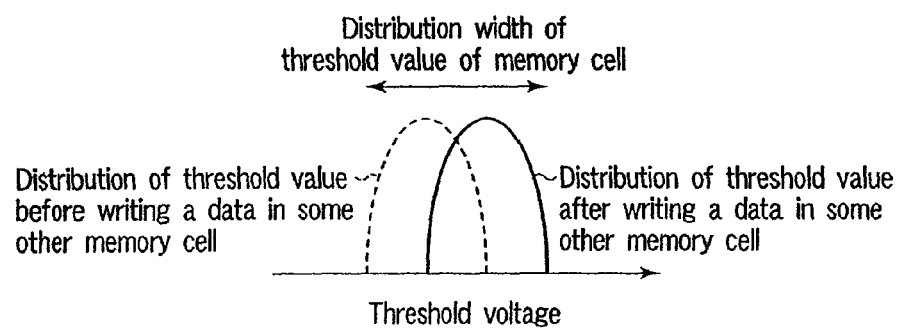

Now, the present invention will be described in greater detail by referring to the accompanying drawing that illustrates preferred embodiment of the invention.

FIG. 2 is a schematic block diagram of the first embodiment of multi-value flash memory according to the invention, illustrating its overall configuration;

Referring to FIG. 2, a plurality of flash memory cells, a plurality of bit lines and a plurality of word lines are arranged in the memory cell array 1. The flash memory cells are arranged in the form of a matrix.

A column control circuit 2 and a row control circuit 3 are arranged adjacently relative to the memory cell array 1. The column control circuit 2 controls the bit lines in the memory cell array 1 for erasing data from, writing data into and reading data from memory cells.

The row control circuit 3 is used for selecting a word line in the memory cell array 1 and supplying a voltage necessary for erasing, writing and reading data.

Additionally, a source line control circuit 4 for controlling source lines of the memory cell array 1 and a P-well control circuit 5 for controlling the p-type wells for forming the memory cell array 1 are also arranged near the memory cell array 1.

Data input/output buffer 6 is connected to a host by way of an external I/O line. The data input/output buffer 6 is adapted to receive data to be written, outputs read out data and receive address data and command data. The data to be written received by the data input/output buffer 6 are forwarded to the column control circuit 2. The data input/output buffer 6 receives the read out data from the column control circuit 2.

An external address data is sent to the column control circuit 2 and the row control circuit 3 by way of state machine 8 in order to select memory cells in the memory cell array 1.

A command data from the host is sent to command interface 7. The command interface 7 receives a control signal from the host and determines if the data input to the data input/output buffer 6 is a data to be written, a command data or an address data. If it is a command data, the command interface 7 forwards the command to the state machine 8 as received command signal.

The state machine 8 controls the overall operation of the flash memory. It receives a command from the host for controlling the operation of reading data, writing data and erasing data and also controls the data input/output operation. The state machine 8 arranged a write counter PC for counting the number of data writing operations to each of the memory cells.

FIG. 3A is a schematic block diagram illustrating the internal configuration of the memory cell array 1 in FIG. 2. The memory cells of the memory cell array 1 are divided into a number of blocks BLOCK0 through BLOCK1023. A block is the smallest unit for an erasing operation. Each of the blocks BLOCKi (i=0 through 1023) includes a total of 8,512 NAND type memory units as shown in FIG. 3B.

In this embodiment, each of the NAND type memory units contains four memory cells M that are connected in series and further to a bit line BLe or BLo at an end thereof by way of a selection gate S1 commonly connected to selection gate lines SGD i and to a common source line C-source at the opposite end thereof by way of a selection gate S2 commonly connected to selection gate lines SGS i.

Each memory cell M has a control gate, a floating gate, a source and a drain. The control gates of the four memory cell M of each NAND type memory unit are commonly connected to the corresponding one of the word lines WL0 i through WL3 i.

Data are independently written into and read out from the even-numbered bit lines BLe and the odd-numbered bit lines BLo as counted from 0. Data are simultaneously written into or read out from 4,256 memory cells connected to the even-numbered bit lines BLe out of the 8,512 memory cells whose control gates are connected to a single word line WL.

When each memory cell stores a 1-bit data, the 4,256 bits data stored in 4,256 memory cells constitute a unit of page. Thus, when a single memory cell stores a 2-bit data, the 4,256 memory cells store data of two pages. Data of other two pages are stored in the 4,256 memory cells connected to the odd-numbered bit lines BLo. Data are written into or read out from the memory cells of a same page simultaneously.

Figure 4:
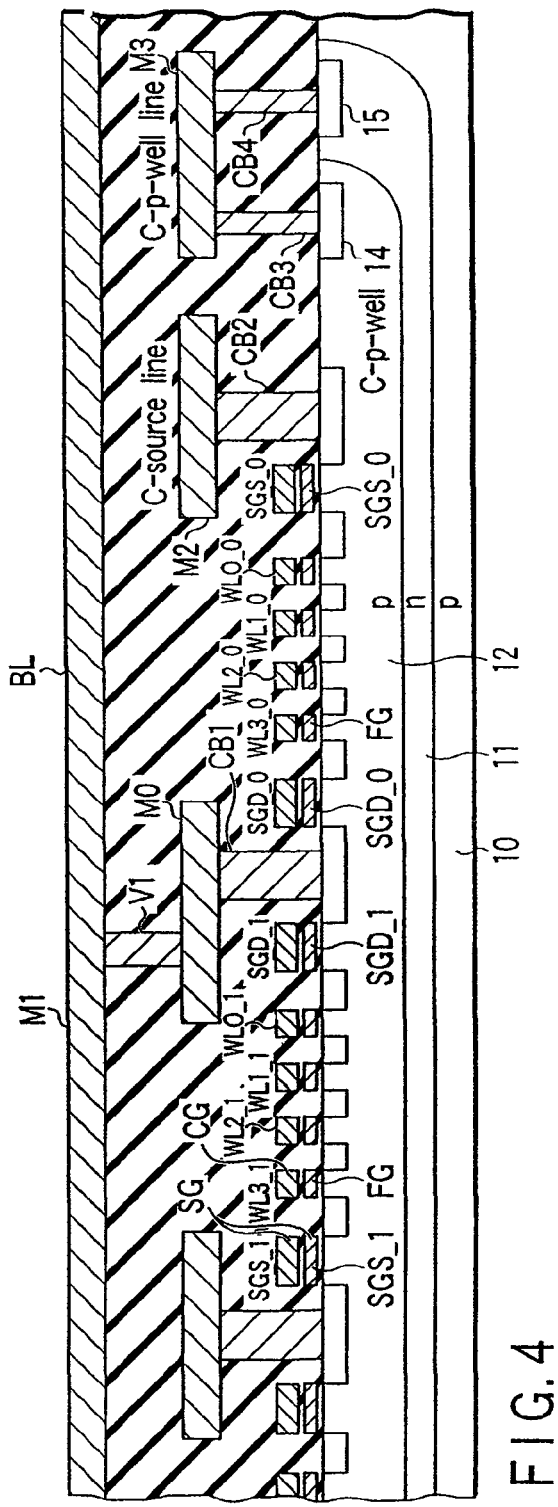
FIG. 4 is a schematic cross sectional view of the memory cell array of FIG. 2 taken along the column direction to show the structure of the device.

FIG. 4 is a schematic cross sectional view of the memory cell array 1 of FIG. 2 taken along the column direction to show the structure of the device. Referring to FIG. 4, an n-type well 11 is formed on a p-type substrate 10 and a p-type well 12 is formed in the n-type well 11. Each memory cell M comprises a source and a drain formed in an n-type diffusion layer 13, a floating gate FG arranged in a channel region between the source and the drain by way of a tunnel oxide film and a control gate CG arranged on the floating gate FG by way of an insulating film and operating as word line WL.

Each of the selection gates S1, S2 includes a source and a drain formed in the n-type diffusion layer 13 and a selection gate line SG having a two-layer structure. Both the word line WL and the selection gate line SG are connected to the row control circuit 3 in FIG. 2 and controlled by the output signal from the row control circuit 3.

Each NAND type memory unit including four memory cells M and selection gates S1, S2 is connected at an end thereof to the metal wiring layer M0 of the first layer by way of a contact hole CB1. The metal wiring layer M0 is connected to the metal wiring layer M1 of the second layer operating as bit line BL by way of a via hole V1. The bit line BL is connected to the column control circuit 2 in FIG. 2.

The NAND type memory unit is connected at the other end thereof to the metal wiring layer M2 of the first layer operating as common source line C-source by way of still another contact hole CB2. The common source line C-source is connected to the source line control circuit 4 in FIG. 2.

An n-type diffusion layer 14 is formed on the surface of the n-type well 11, while a p-type diffusion layer 15 is formed on the surface of the p-type well 12. Both of the n-type diffusion layer 14 and the p-type diffusion layer 15 are connected to the metal wiring layer M3 of the first layer operating as well line C-p-well by way of respective contact holes CB3, CB4. The well line C-p-well is connected to the P well control circuit 5 in FIG. 2.

Figure 5A:
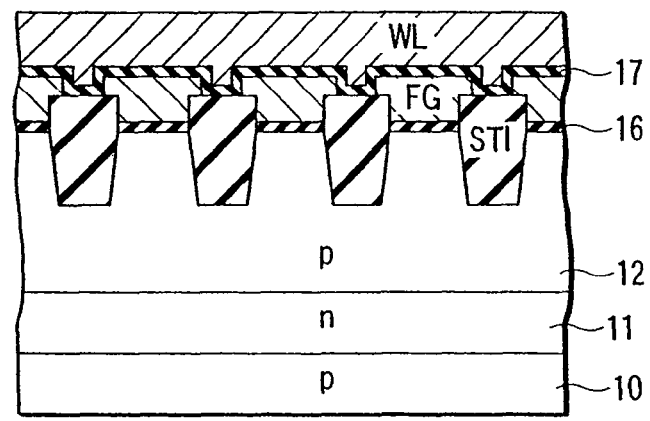
FIGS. 5A and 5B are schematic cross sectional views of the memory cell array of FIG. 2 taken along the row direction to show the structure of the device.
Figure 5B:
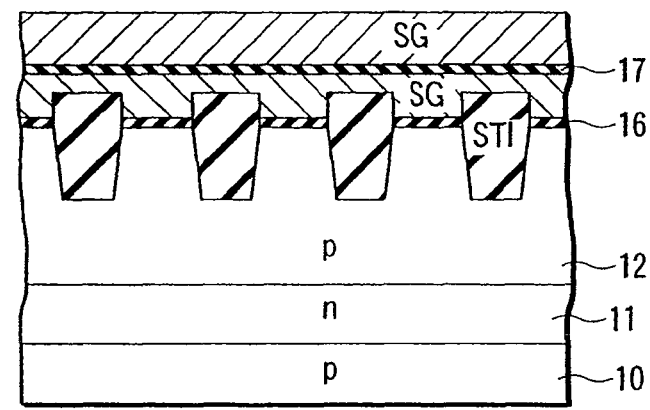

FIGS. 5A and 5B are schematic cross sectional views of the memory cell array 1 taken along the row direction to show the structure of the device. As shown in FIGS. 5A and 5B, each memory cell is isolated from the remaining memory cells by element isolations STI.

As shown in FIG. 5A, in each memory cell, a floating gate FG is laid on a channel region by way of a tunnel oxide film 16. A word line WL is laid on the floating gate FG by way of an insulating film 17 that is an ONO film.

As shown in FIG. 5B, the selection gate line SG has a two-layer structure. The upper layer selection gate line SG and the lower layer selection gate line SG are connected to an end of the memory cell array 1 or a predetermined number of bit lines.

Figure 6:
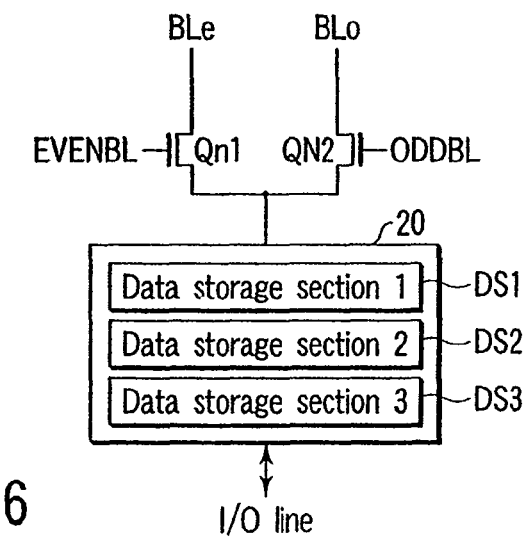
FIG. 6 is a schematic block diagram of a principal part of the column control circuit of FIG. 2, illustrating its configuration.

FIG. 6 is a schematic block diagram of a principal part of the column control circuit 2 of FIG. 2, illustrating its configuration.

In the column control circuit 2, a data storage circuit 20 is arranged for every two bit lines including an even-numbered bit line BLe and an odd-numbered bit line BLo having a same column number. In the column control circuit 2, a sense amplifier is also arranged for the data storage circuit 20 in order to write data into and read data from memory cells.

Referring to FIG. 6, an n-channel MOS transistor Qn1 is connected for column selection between the data storage circuit 20 and the even-numbered bit line BLe, whereas another n-channel MOS transistor Qn2 is connected for column selection between the data storage circuit 20 and the odd-numbered bit line BLo.

Either of the even-numbered bit line BLe or the odd-numbered bit line BLo connected to each data storage circuit 20 is selected and connected to the data storage circuit 20 to control the operation of writing a data or that of reading a data. More specifically, when signal EVENBL is at level H and signal ODDBL is at level L, the MOS transistor Qn1 is made electrically conductive to select the even-numbered bit line BLe, which bit line BLe is then connected to the data storage circuit 20. When, on the other hand, when signal EVENBL is at level L and signal ODDBL is at level H, the MOS transistor Qn2 is made electrically conductive to select the odd-numbered bit line BLo, which bit line BLo is then connected to the data storage circuit 20. Note that the signal EVENBL is supplied to all the n-channel MOS transistors for column selection connected to the even-numbered bit lines BLe, whereas the signal ODDBL is supplied to all the n-channel MOS transistors for column selection connected to the odd-numbered bit lines BLo. The unselected bit lines BL are controlled by some other circuit (not shown).

Each data storage circuit 20 includes three binary data storage sections DS1, DS2, DS3, of which the data storage section DS1 is connected to the data input/output buffer 6 by way of an internal data input/output line (I/O line) and stores an externally input data to be written or a read out data to be externally output, while the data storage section DS2 stores the detection outcome of a write verify operation for confirming the threshold value of a memory cell after a write operation and the data storage section DS3 temporarily stores the data of a memory cell at the time of writing it and at the time of reading it.

Figure 7:
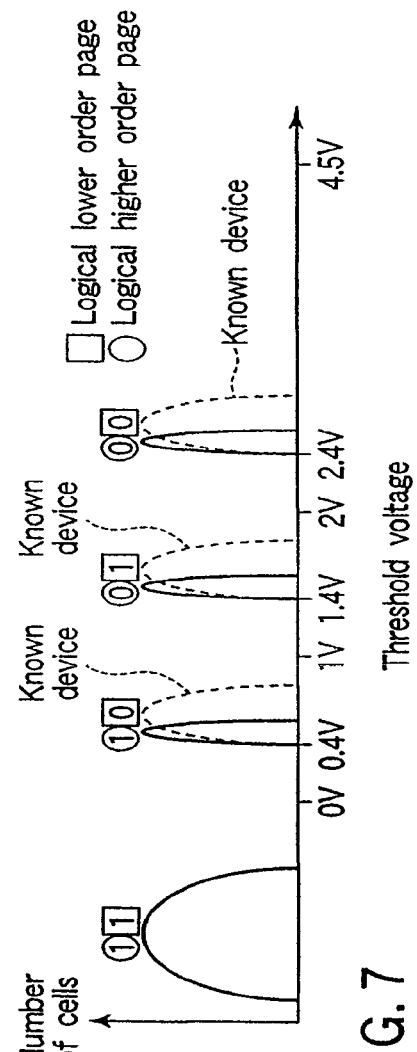
FIG. 7 is a graph illustrating the relationship between a multi-valued data and the threshold value of a memory cell of the first embodiment of multi-value flash memory according to the invention.

FIG. 7 is a graph illustrating the relationship between a multi-valued data and the threshold value of a memory cell of the first embodiment of multi-value flash memory according to the invention.

Now, the operation of the embodiment of multi-valued flash memory according to the invention and having the above described configuration will be described below by referring to FIG. 7. Assume that each memory cell of this embodiment is adapted to store two bits or a four-valued data. It will be appreciated that a 2-bit data is "11", "10", "01" or "00". The two bits belong respectively to different row addresses (different pages).

A four-valued data is stored in a memory cell with different threshold values. Referring to FIG. 7, assume that a data showing the lowest threshold value (e.g., the threshold voltage is negative) represents "11" and a data, showing the second lowest threshold value (e.g., the threshold voltage is positive) represents "10", while a data showing the third lowest threshold value (e.g., the threshold voltage is positive) represents "01" and a data showing the highest threshold value (e.g., the threshold voltage is positive) represents "00".

After an erasing operation, the data in the memory cell is "11". If the data of the lower order page written into this memory cell is "0", the state of the memory cell shifts from "11" to "10" as a result of the writing operation. If the data written into this memory cell is "1", the state of the memory cell remains to be "11".

Then, the data of the higher order page is written into the memory cell. If the written data is "1", the state of the memory cell remain from "11" or "10". If the written data is "0", the state of the memory cell shift either from "11" to "01" or from "10" to "00".

During a write operation, the data written into a memory cell is read out and a so-called write verify operation is conducted to verify if the writing operation is satisfactory.

The data read out by the sense amplifier is regarded as "11" if the threshold value is not higher than 0V and as "10 if the threshold value is not lower than 0V and not higher than 1V, whereas the data is regarded as "01" if the threshold value is not lower than 1V and not higher than 2V and as "00" if the threshold value is not lower than 2V.

Thus, four-value threshold values are used for storing a 2-bit data in a memory cell. In actual devices, the performance of the memory cells can vary from memory cell to memory cell and hence their threshold values can also vary. If they vary to a large extent, it will be no longer possible to identify the data stored in each memory cell and a wrong data may be read out.

This embodiment of multi-valued flash memory is adapted to suppress dispersion of threshold value in a manner as indicated by a solid line in FIG. 7 unlike the dispersion of threshold value observed in known flash memories as indicated by broken lines in FIG. 7. This point will be describe in detail to below.

Table 1 shows typical voltages of various parts of the first embodiment of multi-valued flash memory in erase, write, read and write verify operations. Note that, the values shown in Table 1 are obtained when the word line WL2 and the even-numbered bit lines BLe are selected for write and read operations.

TABLE 1

|  | Erase | First step write | Second step write | Write inhibit | "10" read | "01" read | "00" read |
|---|---|---|---|---|---|---|---|
| BLe | Floating | 0 V | 0.4 V | Vdd | H or L | H or L | H or L |
| BLo | Floating | Vdd | Vdd | Vdd | 0 V | 0 V | 0 V |
| SGD | Floating | Vdd | Vdd | Vdd | 4.5 V | 4.5 V | 4.5 V |
| WL3 | 0 V | 10 V | 10 V | 10 V | 4.5 V | 4.5 V | 4.5 V |
| WL2 | 0 V | Vpgm | Vpgm | Vpgm | 0 V | 1 V | 2 V |
| WL1 | 0 V | 0 V | 0 V | 0 V | 4.5 V | 4.5 V | 4.5 V |
| WL0 | 0 V | 10 V | 10 V | 10 V | 4.5 V | 4.5 V | 4.5 V |
| SGS | Floating | 0 V | 0 V | 0 V | 4.5 V | 4.5 V | 4.5 V |
| C-source | Floating | 0 V | 0 V | 0 V | 0 V | 0 V | 0 V |
| C-p-well | 20 V | 0 V | 0 V | 0 V | 0 V | 0 V | 0 V |

|  | "10" first step write verify | "10" second step write verify | "01" first step write verify | "01" second step write verify | "00" first step write verify | "00" second step write verify |
|---|---|---|---|---|---|---|
| BLe | H or L | H or L | H or L | H or L | H or L | H or L |
| BLo | 0 V | 0 V | 0 V | 0 V | 0 V | 0 V |
| SGD | 4.5 V | 4.5 V | 4.5 V | 4.5 V | 4.5 V | 4.5 V |
| WL3 | 4.5 V | 4.5 V | 4.5 V | 4.5 V | 4.5 V | 4.5 V |
| WL2 | 0.2 V | 0.4 V | 1.2 V | 1.4 V | 2.2 V | 2.4 V |
| WL1 | 4.5 V | 4.5 V | 4.5 V | 4.5 V | 4.5 V | 4.5 V |
| WL0 | 4.5 V | 4.5 V | 4.5 V | 4.5 V | 4.5 V | 4.5 V |
| SGS | 4.5 V | 4.5 V | 4.5 V | 4.5 V | 4.5 V | 4.5 V |
| C-source | 0 V | 0 V | 0 V | 0 V | 0 V | 0 V |
| C-p-well | 0 V | 0 V | 0 V | 0 V | 0 V | 0 V |

For an erase operation, 20V and 0V are supplied respectively to the p-type well 12 (well line C-p-well) and all the word lines WL0 of the selected block. Electrons are discharged from the floating gates FG of all the memory cells M of the block so that the threshold value becomes negative to show a state of "11". While the word lines and the bit lines BL of the unselected blocks are brought to an electrically floating state, they show a voltage level close to 20V as a result of the capacitive coupling with the p-type well 12.

For writing a data, a first step operation, a second step operation and a write inhibiting operation are conducted sequentially. Firstly, program voltage (write voltage) Vpgm of about 14V to 20V is supplied to the selected word line WL2. A high voltage such as 10V is supplied to each of the unselected word lines, including, say, the word line WL3, of the memory cells located at the bit line side relative to the selected memory cells in order to make the memory cells connected to the word line WL3 electrically conductive. On the other hand, a low voltage such as 0V is supplied to each of the unselected word lines, including, say the word line WL1, of the memory cells located at the side of the well line C-p-well relative to the selected memory cells in order make the memory cells connected to the word line WL1 electrically non-conductive. The selected bit lines BLe is supplies a voltage such as 0V. As a result, the 0V supplied to the selected bit lines BLe are transferred to the drains of the selected memory cells and the electric potential of the floating gates FG is raised by the capacitive coupling of the control gates CG and that of the floating gates FG so that electrons are injected into the floating gates FG from the drain by way of the tunnel oxide film (the tunnel oxide film 16 of FIG. 5A) due to the tunneling phenomenon and the threshold value is rapidly raised (the first step write operation). The voltage of the bit lines BLe is raised to 0.4V to suppress the rate at which the threshold value rises in a write operation (the second step write operation). The bit lines BLe are made to show a sufficiently high voltage, e.g., the supply voltage Vdd (up to 3V) for completely blocking the rise of the threshold value (write inhibition).

A read operation is conducted by sequentially supplying different read voltages (0V, 1V, 2V) to the selected word line WL2. A voltage that makes the unselected memory cells electrically conductive, typically 4.5V, is supplied to the unselected remaining word lines. If the threshold value of the selected memory cells is lower than the read voltage, the bit lines BLe and the common source line C-source are made electrically communicative with each other so that an electric current flows through them to bring the electric potential of the bit lines BLe to a relatively low level, or level L. If, on the other hand, the threshold value of the selected memory cells is higher the read voltage, the bit lines BLe and the common source line C-source are made electrically non-communicative with each other to bring the electric potential of the bit lines BLe to a relatively high level, or level H. The read voltage is typically made equal to 0V and a read operation is conducted (to read "10") for checking if the electric potential of a memory cell is higher than the threshold value corresponding to the state of "10" or not. The read voltage is typically made equal to 1V and a read operation is conducted (to read "01") for checking if the electric potential of a memory cell is higher than the threshold value corresponding to the state of "01" or not. The read voltage is typically made equal to 2V and a read operation is conducted (to read "00") for checking if the electric potential of a memory cell is higher than the threshold value corresponding to the state of "00" or not.

A data is written into a memory cell in the state of "10" so as to make the threshold value not smaller than 0.4V in order to provide a read margin of 0.4V for the read voltage of 0V. Thus, the operation of writing "10" is inhibited when the threshold value of the memory cell has got to 0.4V as a result of a write verify operation.

Conventional devices comparable to this embodiment are only adapted to check if the threshold value has got to 0.4V or not so that the threshold value shows a relatively broad distribution width as shown in FIG. 7.

To the contrary, this embodiment of the present invention is adapted to check if the threshold value has got to a level slightly lower than the target threshold value or not and the rate at which the threshold value rises is suppressed in the second step write operation. Therefore, it is now possible to narrow the distribution width of the threshold value as indicated by the solid line in FIG. 7. The above description also applies to the states of "01" and "00".

A write verify operation is conducted by sequentially supplying different verify voltages, e.g., 0.2V, 0.4V, 1.2V, 1.4V, 2.2V, 2.4V to the selected word line WL2. If the threshold value of the selected memory cells is lower than the verify voltage, the bit lines BLe and the common source line C-source are made electrically communicative with each other so that an electric current flows through them to bring the electric potential of the bit lines BLe to a relatively low level, or level L. If, on the other hand, the threshold value of the selected memory cells is higher than the verify voltage, the bit lines BLe and the common source line C-source are made electrically non-communicative with each other to bring the electric potential of the bit lines BLe to a relatively high level, or level H.

If the target threshold value of the memory cell is 0.4V, the verify voltage is reduced typically to 0.2V for a write verify operation in order to check if the threshold value of the memory cell is higher than a level slightly lower than the target threshold value, which is 0.2V in this embodiment, or not (the first step operation of write verify "10"). The verify voltage is made equal to 0.4V and a write verify operation is conducted in order to check if the threshold value of the memory cell is higher than 0.4 or not (the second step operation of write verify "10").

If the target threshold value of the memory cell is 1.4V, the verify voltage is reduced typically to 1.2V for a write verify operation in order to check if the threshold value of the memory cell is higher than a level slightly lower than the target threshold value, which is 1.2V in this embodiment, or not (the first step operation of write verify "01"). The verify voltage is made equal to 1.4V and a write verify operation is conducted in order to check if the threshold value of the memory cell is higher than 1.4V or not (the second step operation of write verify "01").

If the target threshold value of the memory cell is 2.4V, the verify voltage is reduced to 2.2V for a write verify operation in order to check if the threshold value of the memory cell is higher than a level slightly lower than the target threshold value, which is 2.2V in this embodiment, or not (the first step operation of write verify "00"). The verify voltage is made equal to 2.4V and a write verify operation is conducted in order to check if the threshold value of the memory cell is higher than 2.4 or not (the second step operation of write verify "00").

Figure 8:
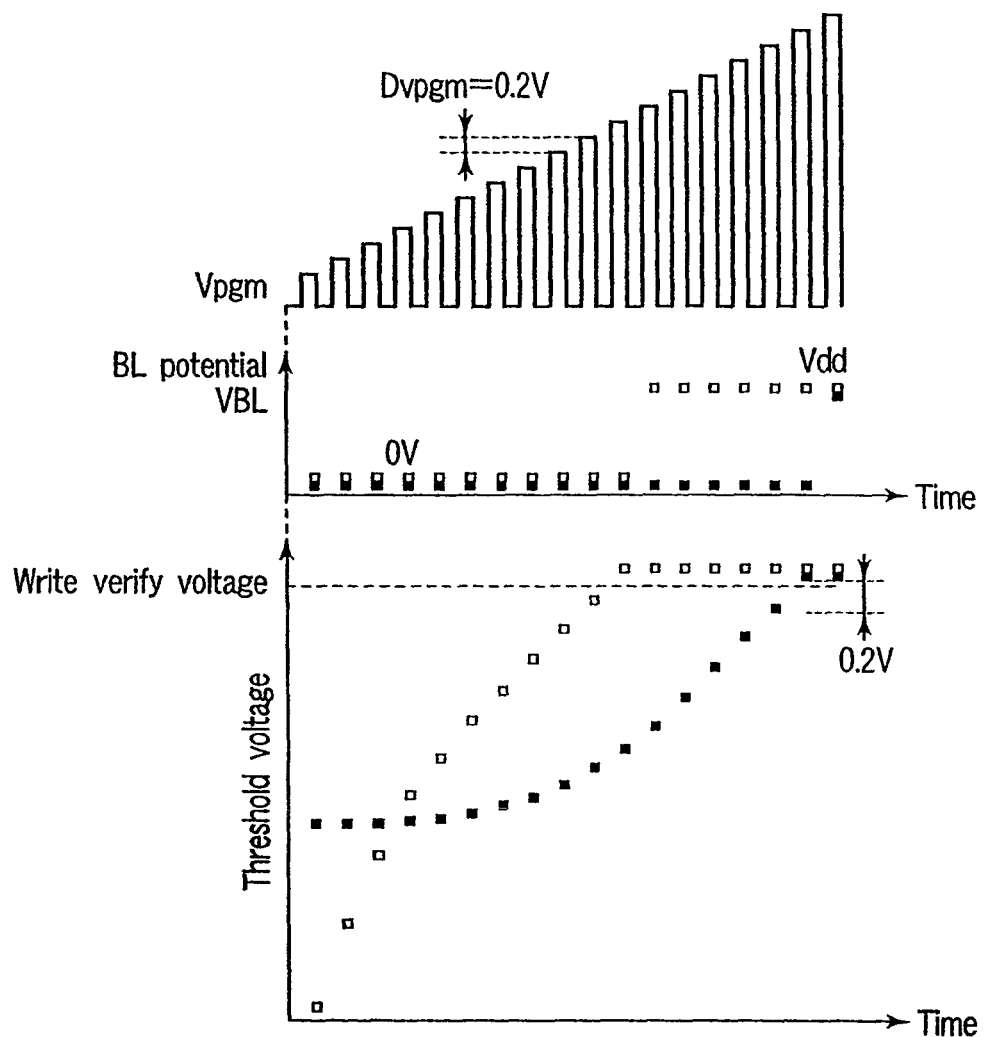
FIG. 8 is a graph illustrating the changing threshold value of memory cells of a known flash memory and a data writing method adapted to use such a changing threshold value.

FIG. 8 is a graph illustrating the changing threshold value of memory cells of a known flash memory and a data writing method adapted to use such a changing threshold value. In FIG. 8, the small white squares indicate the threshold value and the write control voltage (the voltage of the bit line BL) to be supplied to a memory cell where a data can be easily written, whereas the small black squares indicate the threshold value and the write control voltage (the voltage of the bit line BL) to be supplied to a memory cell where a data can be hardly written. The two memory cells stores the data of a same page. The data are erased from both of them in the initial state and they show a negative threshold value.

The write voltage Vpgm is divided into a number of pulses and the pulses are made to rise stepwise typically by 0.2V at a time. In other words, the write voltage Vpgm increased with a stepwise increment Dvpgm of 0.2V per pulse.

As the voltage of the bit line BL that is the write control voltage is made equal to 0V, the threshold value rises at a rate of 0.2V/pulse which is equal to the increment of the write voltage Vpgm after several pulses. A write verify operation is conducted after the application of each write pulse and the write operation is inhibited at each memory cell whose threshold value, becomes to a bit line voltage Vdd of the memory cell detected to have got to the level of the write verify voltage. Thus, the threshold value shows a distribution width of 0.2V.

Figure 9:
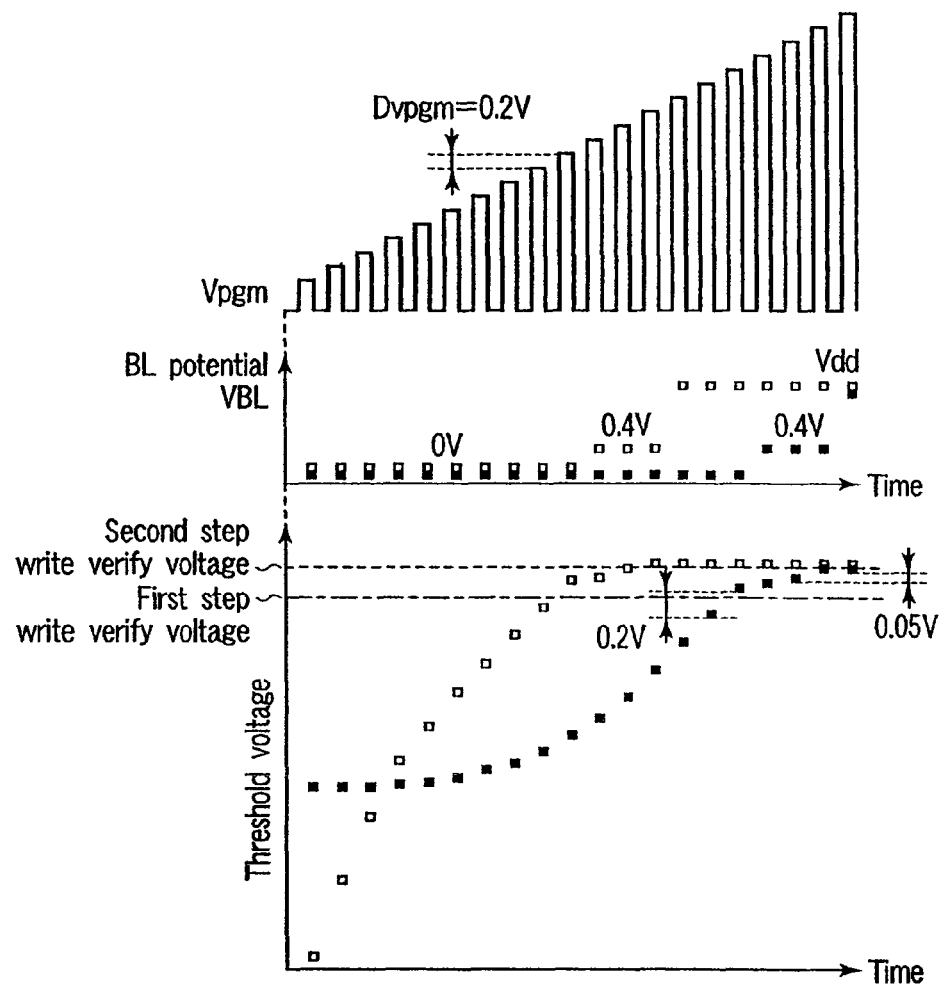
FIG. 9 is a graph illustrating the changing threshold value of a memory cell of the first embodiment of multi-value flash memory according to the invention and a data writing method adapted to use such a changing threshold value.

FIG. 9 is a graph illustrating the changing threshold value of a memory cell of the first embodiment of multi-value flash memory according to the invention and a data writing method adapted to use such a changing threshold value. As in the case of FIG. 8, the small white squares indicate the threshold value and the write control voltage (the voltage of the bit line BL) to be supplied to a memory cell where a data can be easily written, whereas the small black squares indicate threshold values and a write control voltage (the voltage of the bit line BL) to be supplied to a memory cell where a data can be hardly written. The two memory cells stores the data of the respective columns of a same page. The data are erased from both of them in the initial state and they show a negative threshold value.

The write voltage Vpgm is divided into a number of pulses and the pulses are made to rise stepwise typically by 0.2V at a time. In other words, the write voltage Vpgm increases with a stepwise increment Dvpgm of 0.2V per pulse.

The voltage of the bit line BL that is the write control voltage is made equal to 0V and a first step write operation is conducted. In the first step write operation, the threshold value rises at a rate of 0.2V/pulse which is equal to the increment of the write voltage Vpgm after the supplied several pulses. A first step write verify operation or a second step write verify operation is conducted after the application of each write pulse.

The voltage of the bit line of the memory cell whose threshold value has got to the first step write verify voltage is subsequently increased to 0.4V and the second step write operation is conducted on a memory cell by memory cell basis. The voltage of the bit line of the memory cell whose threshold value has got to the second step write verify voltage is subsequently brought to Vdd to inhibit any write operation on a memory cell by memory cell basis.

In the second step write operation, the rising rate of the threshold value is held lower than the 0.2V/pulse of the first step write operation for several pulses. In other words, while the voltage of the bit lines BL, or the write control voltage, is 0V in the first step write operation, it rises to 0.4 in the second step write operation. Therefore, it is more difficult to write data in the second step write operation than in the first step write operation. The rising rate of the threshold value in the second step write operation is typically held within a range between 0V/pulse and 0.05V/pulse. In other words, the threshold value shows a distribution width of as small as 0.05V in the second step write operation.

If the write pulse width is 20 μsec. and the time required for a write verify operation is 5 μsec., the duration of a write operation is conventionally (20 μsec.+5 μsec.)×18 pulses=450 μsec.

Conventionally, the voltage increment Dvpgm of write voltage Vpgm needs to be made equal to 0.05V, or a quarter of 0.2V, in order to realize a threshold value distribution width of 0.05V. Then, the duration of a write operation is 450 μsec×4=1800 μsec.

On the other hand, with this embodiment, as shown in FIG. 9, it is possible to realize a threshold value distribution width of 0.05V by using a voltage increment Dvpgm of 0.2V/pulse so that the duration of a write time is (20 μsec.+5 μsec.+5 μsec.)×20 pulses=600 μsec.

Thus, the duration of the write operation necessary for realizing a threshold value distribution width of 0.05V in this embodiment is reduced to a third of that of the above known device.

"10" is written by using a "10" first step write verify voltage and a "10" second step write verify voltage respective for first step write verify voltage and for the second step write verify voltage.

Figure 10:
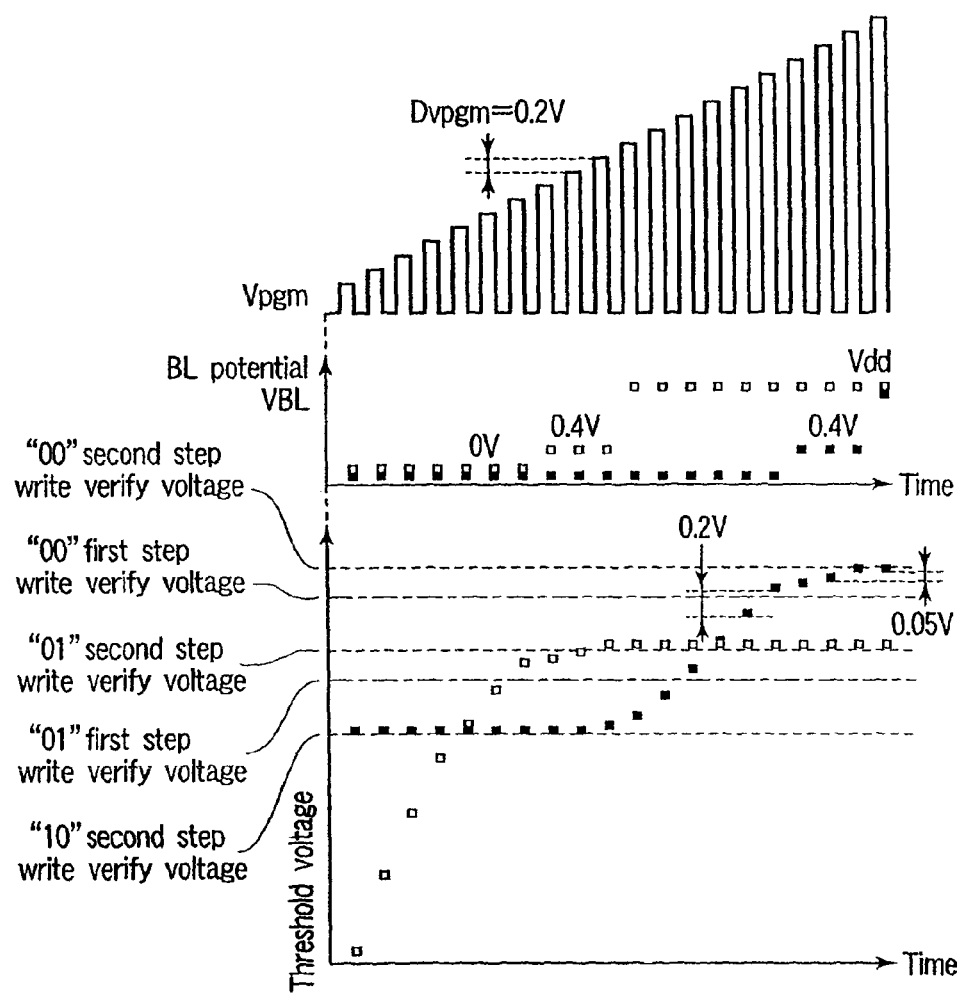
FIG. 10 is a graph illustrating the method for writing a higher order page data into a same memory cell and the change with time of the threshold value of the memory of the first embodiment.

FIG. 10 is a graph illustrating the method for writing a higher order page data into a same memory cell and the change with time of the threshold value of the memory of the first embodiment. As in the case of FIGS. 8 and 9, the small white squares indicate the threshold value and the write control voltage (the voltage of the bit line BL) to be supplied to a memory cell where a data can be easily written, whereas the small black squares indicate threshold values and a write control voltage (the voltage of the bit line BL) to be supplied to a memory cell where a data can be hardly written. The two memory cells stores the data of the respective columns of a same page.

The data in the memory cell whose write control voltage is indicated by white squares, where a data can be easily written, is erased in the initial state and the memory cell shows a negative threshold value. Assume that a date is written in the memory cell to make it show to show a "01" state. A data is already written in the memory cell whose write control voltage is indicated by black squares to make it show a "10" state in the initial state. Assume that a data is written to the memory cell to make it show a "00" state.

The write voltage Vpgm is divided into a number of pulses and the pulses are made to rise stepwise typically by 0.2V at a time. In other words, the write voltage Vpgm increases with a stepwise increment Dvpgm of 0.2V per pulse.

The voltage of the bit line BL that is the write control voltage is made equal to 0V and a first step write operation is conducted. In the first step write operation, the threshold value rises at a rate of 0.2V/pulse which is equal to the increment of the write voltage Vpgm after several pulses. A "01" first step write verify operation is conducted after the application of each write pulse. After the write operation using a threshold value slightly lower than the target threshold value, a "01" second step write verify operation is conducted after the application of each write pulse. Thereafter, a "00" first step write verify operation and a "00" second step write verify operation are conducted.

When the threshold value of the memory cell indicated by white squares is detected to have got to the "01" first step write verify voltage, subsequently the bit line voltage is made equal to 0.4V and the process proceeds to the second step write operation. When the threshold value of the memory cell indicated by black squared is detected to have got to the "00" first step write verify voltage, subsequently the bit line voltage is made equal to 0.4V and the process proceeds to the second step write operation.

Furthermore, when the threshold value of the memory cell indicated by white squares is detected to have got to the "01" second step write verify voltage, subsequently the bit line voltage is made equal to Vdd and the write operation is inhibited. Finally, when the threshold value of the memory cell indicated by black squares is detected to have got to the "00" second step write verify voltage, subsequently the bit line voltage is made equal to Vdd and the write operation is inhibited.

After the second step write operation starts for both the data "01" and the data "00", the increment of the threshold value is typically held within a range between about 0V/pulse and 0.05V/pulse for several pulses of the write voltage. Therefore, the threshold value shows only a distribution width of 0.05V.

Figure 11:
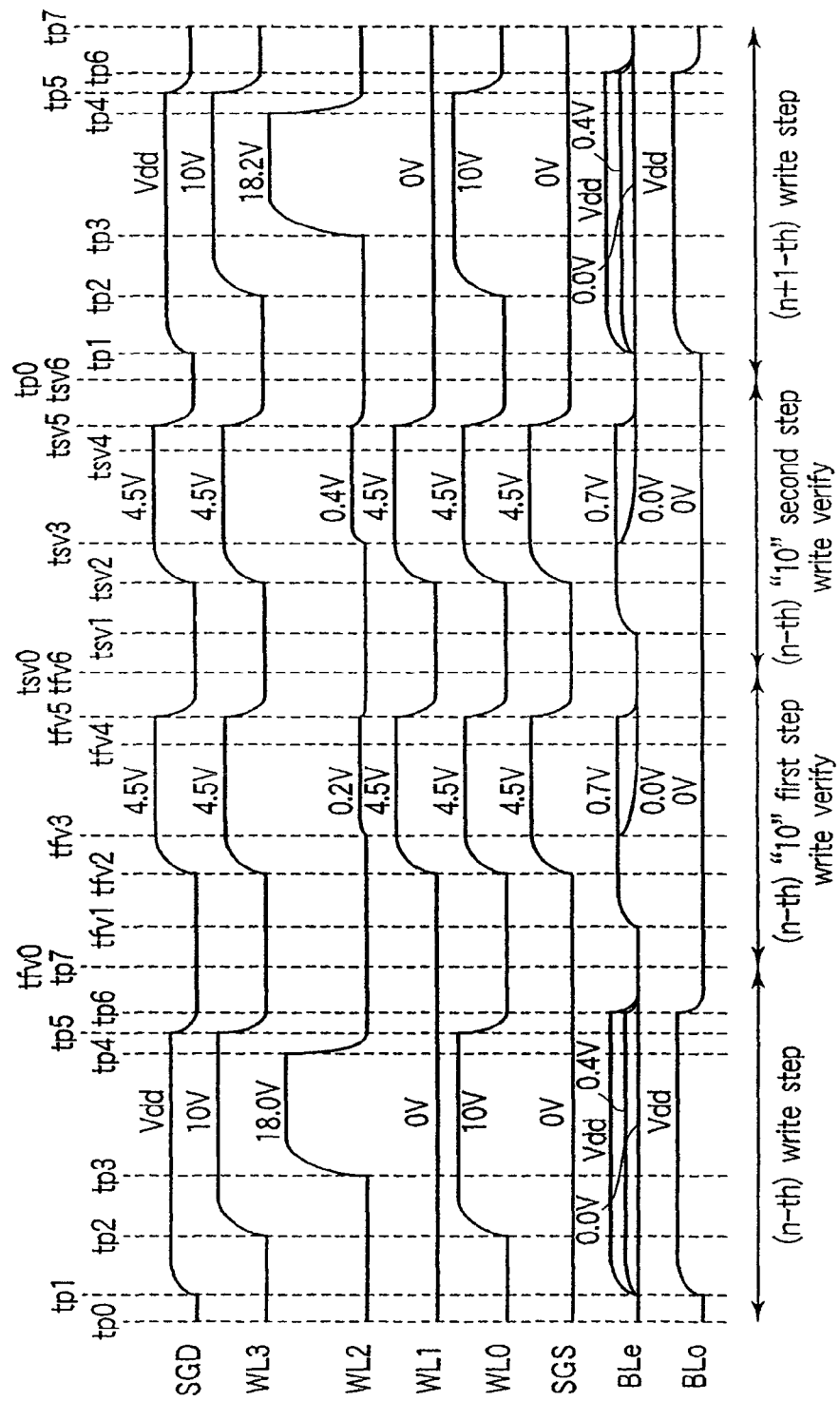
FIG. 11 is a graph illustrating the signal waveforms of different parts of the first embodiment of flash memory according to the invention when writing a lower order page data into a single memory cell.

FIG. 11 is a graph illustrating the signal waveforms of different parts of the first embodiment of flash memory according to the invention when writing a lower order page data into a single memory cell.

Referring to FIG. 11, the write step continues from time tp0 to time tp7. A write pulse is applied during this period. The "10" first step write verify operation continues from time tfv0 to time tfv6. Then, the period of time from time tsv0 to time tsv6 is assigned to the "10" second step write verify operation. In this instance, it is assumed that the word line WL2 and the even-numbered bit lines BLe are selected.

In the write step, the voltage of the bit lines BLe that is the write control voltage is brought to 0V for the first step write operation and to 0.4V for the second step write operation, whereas it is brought to Vdd (e.g., 2.5V) when any write operation is inhibited.

In each write verify period, firstly the bit lines BLe is charged typically to 0.7V. Thereafter, when the selected word line WL2 has gets to the write verify voltage, the bit lines BLe is held to 0.7V if the threshold value of the memory cell has got to the write verify voltage but the voltage of the bit lines BLe is reduced toward 0V if the threshold value of the memory cell has not got to the write verify voltage. If the threshold value of the memory cell has got to the write verify voltage or not can be detected by observing the voltage of the bit lines BLe by means of a sense amplifier at timing of time tfv4 or tsv4. If the threshold value of the memory cell has got to the write verify voltage, the detecting operation is successfully completed.

Figure 12:
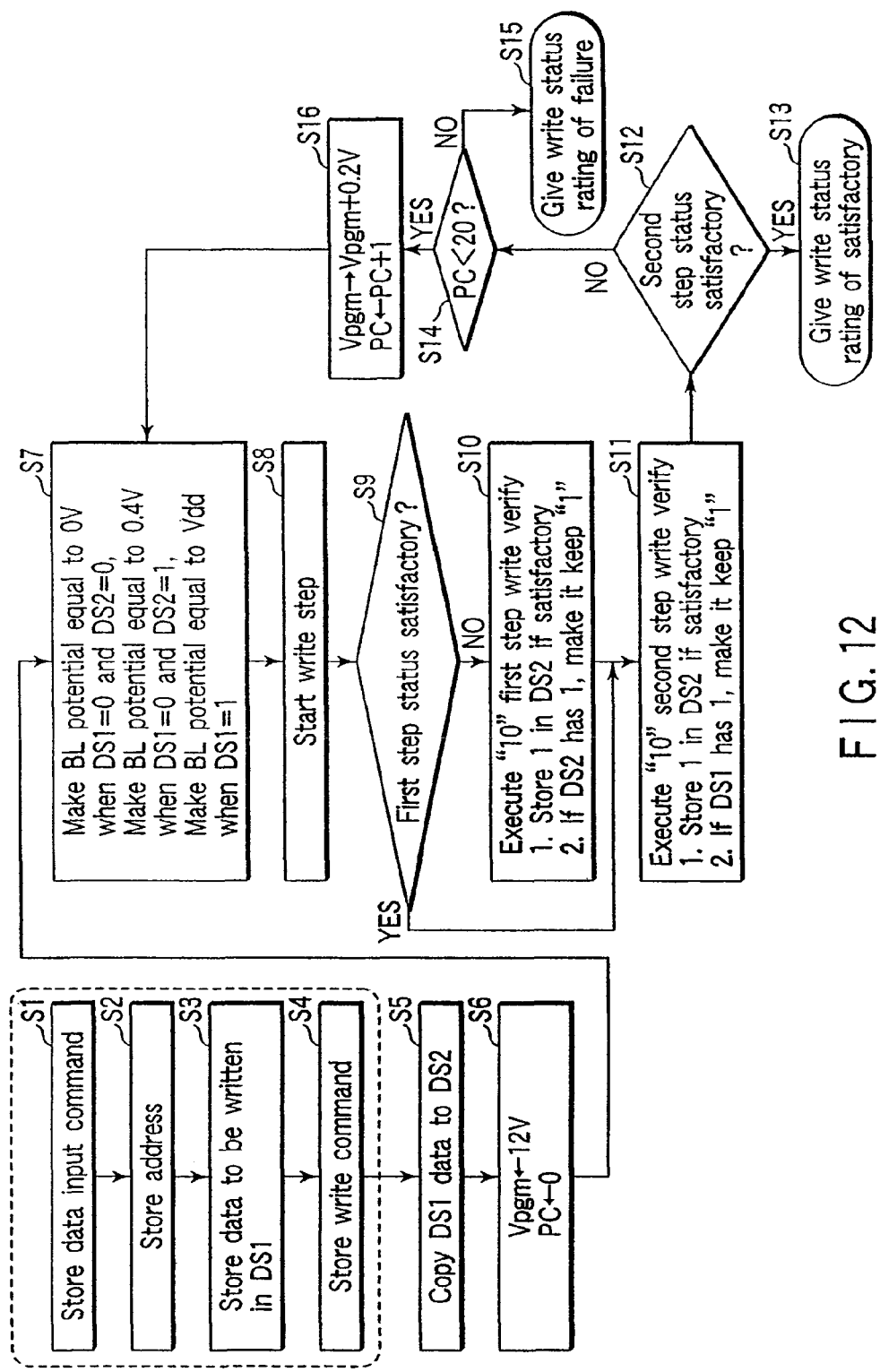
FIG. 12 is a flow chart schematically illustrating the control algorithm of the first embodiment of flash memory according to the invention when writing a lower order page data into a single memory cell.

FIG. 12 is a flow chart schematically illustrating the control algorithm of the first embodiment of flash memory according to the invention when writing a lower order page data into a single memory cell.

The control operation starts with receiving a data input command from the host and placing the data input command in the state machine 8 (S1). Then, the operation proceeds to receiving an address data from the host and placing the address in the state machine 8 to select the page to be used for a write operation (S2). Thereafter, the operation proceeds to a step of receiving data to be written in a page and storing them correspondingly in the respective data storage sections DS1 (S3). Subsequently, the operation proceeds to a step of receiving a write command issued from the host and placing the write command in the state machine 8 (S4). As the write command is placed, the operation of Steps S5 through S16 is automatically started by the state machine 8 in the inside.

The data stored in the data storage sections DS1 are copied respectively to the corresponding data storage sections DS2 (S5). Thereafter, 12V is selected for the initial value of the write voltage Vpgm and the write counter PC is set to 0 (S6). If the data in the data storage sections DS1 are "0"s and the data in the data storage sections DS2 are also "0"s, they indicate a first step write operation and, therefore, the voltage of the bit lines BLe that is the write control voltage is reduced to 0V. If, on the other hand, the data in the data storage sections DS1 are "0"s and the data in the data storage sections DS2 are "1"s, they indicate a second step write operation and, therefore, the voltage of the bit lines BLe that is the write control voltage is brought to 0.4V. If, finally, the data in the data storage sections DS1 are "1"s and the data in the data storage sections DS2 are also "1"s, they indicate write inhibition and, therefore, the voltage of the bit lines BLe that is the write control voltage is brought to Vdd (S7).

Then, the operation proceeds to the write step of applying a write pulse to the memory cells for storing the data of a page by using the selected write voltage Vpgm and the write control voltage (S8). In the next step, if all the data stored in the data storage sections DS2 are "1"s or not is checked and, if they are all "1"s, it is determined that the status of the first step is satisfactory whereas, if all the data stored in the data storage sections DS2 are not "1"s, it is determined that the status of the first step is not satisfactory (S9). As will be described hereinafter, if all the data stored in the data storage sections DS2 are "1"s, there is no memory cell where the first step write operation is conducted in the preceding write step (S8).

If the status of the first step is satisfactory, a "10" first step write verify operation is started (S10) and the data of the data storage sections DS2 corresponding to only the memory cells where the detection outcome is satisfactory out of the memory cells for storing the data of a page are shifted from "0"s to "1"s. The data storage sections DS2 storing "1"s are made to keep on storing "1"s.

When the status of the first step is satisfactory or when the "10" first step write verify operation is completed, a "10" second step write verify operation is started (S11). The data of the data storage sections DS1 corresponding to only the memory cells where the detection outcome is satisfactory out of the memory cells for storing the data of a page are shifted from "0"s to "1"s. The data storage sections DS1 storing "1"s are made to keep on storing "1"s.

After the "10" second step write verify operation, if all the data stored in the data storage sections DS1 are "1"s or not is checked and, if they are all "1"s, it is determined that the status of the second step is satisfactory whereas, if all the data stored in the data storage sections DS2 are not "1"s, it is determined that the status of the second step is not satisfactory (S12). If the status of the second step is satisfactory, it is judged that the write operation has completed successfully and the status of the write operation is rated as satisfactory to terminate the write operation (S13).

If, on the other hand, the status of the second step is not satisfactory, the write counter PC is checked (S14). If the reading of the write counter PC is not less than 20, it is judged that the status of the write operation is failure and the write operation is terminated unsuccessfully (S15). If the reading of the write counter PC is not greater than 20, the reading of the write counter PC is incremented by one and the write voltage Vpgm is raised by 0.2V (S16). Then, the operation is moved back to Step S7 and then the write operation of Step S8 is retried. It will be appreciated that the norm for the write operation is not necessarily be 20 and some other norm may be selected if appropriate.

Table 2 shows the relationship between the data of the data storage sections DS1 and DS2 before and after the "10" first step write verify operation and the threshold value (Vt) of the corresponding memory cells of the write algorithm illustrated in FIG. 12.

TABLE 2

| | | DS1/DS2 data DS1/DS2 after n-th "10" first step write verify Memory cell threshold value Vt | |
|---|---|---|---|
| | | When lower than 0.2 V | When higher than 0.2 V |
| DS1/DS2 data DS1/DS2 before n-th "10" first step write verify | 0/0 0/1 1/1 | 0/0 0/1 1/1 | 0/1 0/1 1/1 |

Immediately before the n-th "10" first step write verify operation, the data of the data storage sections DS1 and DS2 are one of the combinations of 0/0, 0/1 and 1/1. The combination of 0/0 indicates that the threshold value of the memory cells has not got to the "10" first step write verify voltage by the n−1-th write step. The combination of 0/1 indicates that the threshold value of the memory cells has got to the "10" first step write verify voltage but not to the "10" second step write verify voltage by the n−1-th write step. The combination of 1/1 indicates that the threshold value of the memory cells has got to the "10" second step write verify voltage by the n−1-th write step. It is not possible that the threshold value of the memory cells has got to the "10" second step write verify voltage but not to the "10" first step write verify voltage by the n−1-th write step so that the combination of I/O does not exists in this embodiment.

Immediately before the first "10" first step write verify operation, the data of the data storage sections DS1 and DS2 are either of the combinations of 0/0 and 1/1.

If the threshold value of the memory cells has not got to 0.2V which is the "10" first step write verify voltage by the n-th write step, the detection outcome of the "10" first step write verify operation is not satisfactory so that the data in the data storage sections DS2 are not changed. If, on the other hand, the threshold value of the memory cells has got to 0.2V, the detection outcome of the "10" first step write verify operation is satisfactory so that the data in the data storage sections DS2 are shifted to "1"s. The data storage sections DS2 storing "1"s are made to keep on storing "1"s.

Table 3 shows the relationship between the data of the data storage sections DS1 and DS2 before and after the "10" second step write verify operation and the threshold value of the corresponding memory cells of the write algorithm illustrated in FIG. 12.

TABLE 3

| | DS1/DS2 data before n-th "10" second step write verify | DS1/DS2 after n-th "10" second step write verify Memory cell threshold value Vt | |
|---|---|---|---|
| | | When lower than 0.4 V | When higher than 0.4 V |
| DS1/DS2 data DS1/DS2 before n-th "10" second step write verify | 0/0 0/1 1/1 | 0/0 0/1 1/1 | — 1/1 1/1 |

Immediately before the n-th "10" second step write verify operation, the data of the data storage sections DS1 and DS2 are one of the combinations of 0/0, 0/1 and 1/1. The combination of 0/0 indicates that the threshold value of the memory cells has not got to the "10" first step write verify voltage after the end of the n-th write step. The combination of 0/1 indicates that the threshold value of the memory cells has got to the "10" first step write verify voltage by the n-th write step but not to the "10" second step write verify voltage by the n−1th write step. The combination of 1/1 indicates that the threshold value of the memory cells has got to the "10" second step write verify voltage by the end of the n−1-th write step.

It is not possible that the threshold value of the memory cells has got to the "10" second step write verify voltage by the n−1th write step but not to the "10" first step write verify voltage by the n-th write step so that the combination of I/O does not exists in this embodiment.

If the threshold value of the memory cells has not got to 0.4V which is the "10" second step write verify voltage by the n-th write step, the detection outcome of the "10" second step write verify operation is not satisfactory so that the data in the data storage sections DS1 are not changed. If, on the other hand, the threshold value of the memory cells has got to 0.4V, the detection outcome of the "10" second step write verify operation is satisfactory so that the data in the data storage sections DS1 are shifted to "1"s. The data storage sections DS2 storing "1"s are made to keep on storing "1"s. The combination of 0/0 will not be changed by the "10" second write verify operation.

Figure 13:
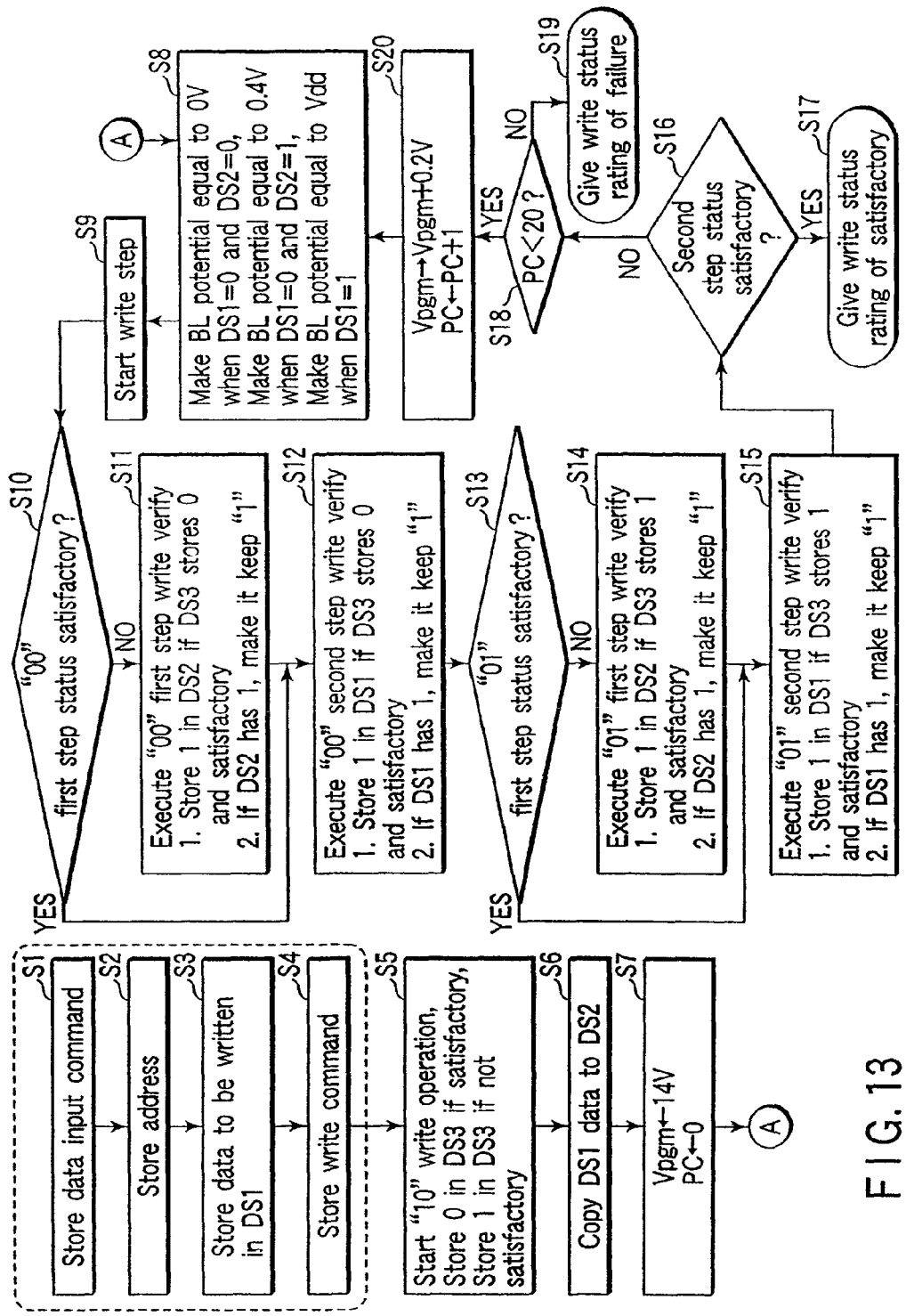
FIG. 13 is a flow chart schematically illustrating the control algorithm of the first embodiment of flash memory according to the invention when writing a higher order page data into a memory cell.

FIG. 13 is a flow chart schematically illustrating the control algorithm of the first embodiment of flash memory according to the invention when writing a higher order page data into a memory cell.

Referring to FIG. 13, the control operation starts with receiving a data input command from the host and placing the data input command in the state machine 8 (S1). Then, the operation proceeds to receiving an address data from the host and placing the address in the state machine 8 to select the page to be used for a write operation (S2). Thereafter, the operation proceeds to a step of receiving data to be written in a page and storing them correspondingly in the respective data storage sections DS1 (S3). Subsequently, the operation proceeds to a step of receiving a write command issued from the host and placing the write command in the state machine 8 (S4). As the write command is placed, the operation of Steps S5 through S20 is automatically started by the state machine 8 in the inside.

Firstly, a "10" write operation is started (S5) and the operation is satisfactory (the data of the memory cells are "10"s, "0"s are stored in the corresponding data storage sections DS3. If the operation is not satisfactory, "1" are stored in the corresponding data storage sections DS3. Thereafter, the data stored in the data storage sections DS1 are copied respectively to the corresponding storage sections DS2 (S6). Then, 14V is selected for the initial value of the write voltage Vpgm and the write counter PC is set to 0 (S7). If the data in the data storage sections DS1 are "0"s and the data in the data storage sections DS2 are also "0"s, they indicate a first step write operation and, therefore, the voltage of the bit lines BL that is the write control voltage is set to 0V. If, on the other hand, the data in the data storage sections DS1 are "0"s and the data in the data storage sections DS2 are "1"s, they indicate a second step write operation and, therefore, the voltage of the bit lines BL that is the write control voltage is set to 0.4V. If, finally, the data in the data storage sections DS1 are "1"s and the data in the data storage sections DS2 are also "1"s, they indicate write inhibition and, therefore, the voltage of the bit lines BL that is the write control voltage is set to Vdd (S8). Then, the operation proceeds to the write step of applying a write pulse to the memory cells for storing the data of a page by using the selected write voltage Vpgm and the write control voltage (S9).

In the next step, in all the data storage circuits 20 where "0"s are stored in the data storage sections DS3, it is checked if all the data stored in the data storage sections DS2 are "1"s or not and, if they are all "1"s, it is determined that the status of the "00" first step is satisfactory whereas, if all the data stored in the data storage sections DS2 are not "1"s, it is determined that the status of the "00" first step is not satisfactory (S10). If all the data stored in the data storage sections DS2 are "1"s, there is no memory cell where the "00" first step write operation is conducted in the preceding write step (S9).

If the status of the "00" first step is not satisfactory, a "00" first step write verify operation is started (S11) and the data of the data storage sections DS2 corresponding to only the memory cells where the detection outcome is satisfactory out of the memory cells for storing the data of a page are shifted from "0"s to "1"s, provided that the data in the data storage sections DS3 are "0". The data storage sections DS2 storing "1"s are made to keep on storing "1"s.

When the status of the "00" first step is satisfactory or when the "00" first step write verify operation is completed, a "00" second step write verify operation is started (S12). The data of the data storage sections DS1 corresponding to only the memory cells where the detection outcome is satisfactory out of the memory cells for storing the data of a page are shifted from "0"s to "1"s, provided that the data in the data storage section DS3 are "0"s. The data storage sections DS1 storing "1"s are made to keep on storing "1"s.

Thereafter, in all the data storage circuits 20 where "0"s are stored in the data storage sections DS3, it is checked if all the data stored in the data storage sections DS2 are "1"s or not is checked, if they are all "1"s, it is determined that the status of the "01" first step is satisfactory whereas, if all the data stored in the data storage sections DS2 are not "1"s, it is determined that the status of that step is not satisfactory (S13). As will be described hereinafter, if all the data stored in the data storage sections DS2 are "1"s, there is no memory cell where the first step write operation is conducted in the preceding write step (S9).

If the status of the "01" first step is not satisfactory, a "01" first step write verify operation is started (S14) and, in all the data storage circuits 20 where "0"s are stored in the data storage sections DS3, the data of the data storage sections DS2 corresponding to only the memory cells where the detection outcome is satisfactory out of the memory cells for storing the data of a page are shifted from "0"s to "1"s, provided that the data in the data storage sections DS3 are "0". The data storage sections DS2 storing "1"s are made to keep on storing "1"s.

When the status of the "01" first step is satisfactory or when the "10" first step write verify operation is completed, a "10" second step write verify operation is started (S15). Then, in all the data storage circuits 20 where "0"s are stored in the data storage sections DS3, the data of the data storage sections DS1 corresponding to only the memory cells where the detection outcome is satisfactory out of the memory cells for storing the data of a page are shifted from "0"s to "1"s. The data storage sections DS1 storing "1"s are made to keep on storing "1"s.

After the "01" second step write verify operation, if all the data stored in the data storage sections DS1 are "1"s or not is checked and, if they are all "1"s, it is determined that the status of the second step is satisfactory whereas, if all the data are not "1"s, it is determined that the status of the second step is not satisfactory (S16). If the status of the second step is satisfactory, it is judged that the write operation has completed successfully and the status of the write operation is rated as satisfactory to terminate the write operation (S17). If, on the other hand, the status of the second step is not satisfactory, the write counter PC is checked (S18). If the reading of the write counter PC is not less than 20, it is judged that the status of the write operation is failure and the write operation is terminated unsuccessfully (S19). If the reading of the write counter PC is not greater than 20, the reading of the write counter PC is incremented by one and the write voltage Vpgm is raised by 0.2V (S20). Then, the operation is moved back to Step S8 and then the write operation of Step S9 is retried. It will be appreciated that the norm for the write operation is not necessarily be 20 and some other norm may be selected if appropriate.

Table 4 shows the relationship between the data of the data storage sections DS1, DS2 and DS3 before and after the "10" first step write verify operation and the threshold value (Vt) of the corresponding memory cells of the write algorithm illustrated in FIG. 13.

TABLE 4

| | DS1/DS2/DS3 data | DS1/DS2/DS3 after n-th "01" first step write verify Memory cell threshold value Vt | |
|---|---|---|---|
| | | When lower than 1.2 V | When higher than 1.2 V |
| DS1/DS2/DS3 data DS1/DS2/D3 before n-th "01" first step write verify | 0/0/1 0/1/1 1/1/1 0/0/0 0/1/0 1/1/0 | 0/0/1 0/1/1 1/1/1 0/0/0 0/1/0 1/1/0 | 0/1/1 0/1/1 1/1/1 0/0/0 0/1/0 1/1/0 |

Immediately before the n-th "01" first step write verify operation, the data of the data storage sections DS1, DS2 and DS3 are one of the combinations of 0/0/1, 0/1/1, 1/1/1, 0/0/0, 0/1/0 and 1/1/0. The combination of 0/0/1 indicates that the threshold value of the memory cells has not got to the "01" first step write verify voltage by the n−1-th write step. The combination of 0/1/1 indicates that the threshold value of the memory cells has got to the "01" first step write verify voltage but not to the "01" second step write verify voltage by the n−1-th write step. The combination of 1/1/1 indicates that the threshold value of the memory cells has got to the "01" second step write verify voltage by the n−1-th write step. It is not possible that the threshold value of the memory cells has got to the "01" second step write verify voltage but not to the "01" first step write verify voltage by the n−1-th write step so that the combination of 1/0/0 does not exists in this embodiment.

If the threshold value of the memory cells has not got to 1.2V which is the "01" first step write verify voltage by the n-th write step, the detection outcome of the "01" second step write verify operation is not satisfactory so that the data in the data storage sections DS2 are not changed. If, on the other hand, the threshold value of the memory cells has got to 1.2V, the detection outcome of the "01" first step write verify operation is satisfactory so that the data in the data storage sections DS2 are shifted to "1"s. The data storage sections DS2 storing "1"s are made to keep on storing "1"s. The combinations of 0/0/0, 0/1/0 and 1/1/0 do not constitute any objects of the first step write verify operation so that they are not changed.

Table 5 shows the relationship between the data of the data storage sections DS1, DS2 and DS3 before and after the "01" second step write verify operation and the threshold value (Vt) of the corresponding memory cells of the write algorithm illustrated in FIG. 13.

TABLE 5

| | DS1/DS2/DS3 data | DS1/DS2/DS3 after n-th "01" second step write verify Memory cell threshold value Vt | |
|---|---|---|---|
| | | When lower than 1.4 V | When higher than 1.4 V |
| DS1/DS2/DS3 data DS1/DS2/D3 before n-th "01" second step write verify | 0/0/1 0/1/1 1/1/1 0/0/0 0/1/0 1/1/0 | 0/0/1 0/1/1 1/1/1 0/0/0 0/1/0 1/1/0 | — 1/1/1 1/1/1 0/0/0 0/1/0 1/1/0 |

Immediately before the n-th "01" second step write verify operation, the data of the data storage sections DS1, DS2 and DS3 are one of the combinations of 0/0/1, 0/1/1, 1/1/1, 0/0/0, 0/1/0 and 1/1/0. The combination of 0/0/1 indicates that the threshold value of the memory cells has not got to the "01" first step write verify voltage after the n-th write step. The combination of 0/1/1 indicates that the threshold value of the memory cells has got to the "01" first step write verify voltage by the n-th write step but not to the "01" second step write verify voltage by the n−1-th write step. The combination of 1/1/1 indicates that the threshold value of the memory cells has got to the "01" second step write verify voltage by the n−1-th write step. It is not possible that the threshold value of the memory cells has got to the "01" second step write verify voltage by the n−1-th write step but not to the "01" first step write verify voltage by the n-th write step so that the combination of I/O/1 does not exists in this embodiment.

If the threshold value of the memory cells has not got to 1.4V which is the "01" second step write verify voltage by the n-th write step, the detection outcome of the "01" second step write verify operation is not satisfactory so that the data in the data storage sections DS1 are not changed. If, on the other hand, the threshold value of the memory cells has got to 1.4V, the detection outcome of the "01" second step write verify operation is satisfactory so that the data in the data storage sections DS1 are shifted to "1"s. The data storage sections DS2 storing "1"s are made to keep on storing "1"s. The combination of 0/0/1 will not be changed by the "01" second write verify operation. The combinations of 0/0/0, 0/1/0 and 1/1/0 do not constitute any objects of the first step write verify operation so that they are not changed.

Table 6 shows the relationship between the data of the data storage sections DS1, DS2 and DS3 before and after the "00" first step write verify operation and the threshold value (Vt) of the corresponding memory cells of the write algorithm illustrated in FIG. 13.

TABLE 6

|  | DS1/DS2/DS3 data | DS1/DS2/DS3 after n-th "00" first step write verify Memory cell threshold value Vt | |
| --- | --- | --- | --- |
|  |  | When lower than 2.2 V | When higher than 2.2 V |
| DS1/DS2/DS3 data | 0/0/1 | 0/0/1 | — |
| DS1/DS2/D3 before | 0/1/1 | 0/1/1 | — |
| n-th "00" first | 1/1/1 | 1/1/1 | — |
| step write verify | 0/0/0 | 0/0/0 | 0/1/0 |
|  | 0/1/0 | 0/1/0 | 0/1/0 |
|  | 1/1/0 | 1/1/0 | 1/1/0 |

Immediately before the n-th "00 first step write verify operation, the data of the data storage sections DS1, DS2 and DS3 are one of the combinations of 0/0/1, 0/1/1, 1/1/1, 0/0/0, 0/1/0 and 1/1/0. The combination of 0/0/0 indicates that the threshold value of the memory cells has not got to the "00" first step write verify voltage by the n−1-th write step. The combination of 0/1/0 indicates that the threshold value of the memory cells has got to the "00" first step write verify voltage but not to the "00" second step write verify voltage by the n−1-th write step. The combination of 1/1/0 indicates that the threshold value of the memory cells has got to the "00" second step write verify voltage. It is not possible that the threshold value of the memory cells has got to the "00" second step write verify voltage but not to the "00" first step write verify voltage by the n−1-th write step so that the combination of 1/0/0 does not exists in this embodiment.

If the threshold value of the memory cells has not got to 2.2V which is the "00" first step write verify voltage by the n-th write step, the detection outcome of the "00" first step write verify operation is not satisfactory so that the data in the data storage sections DS2 are not changed. If, on the other hand, the threshold value of the memory cells has got to 2.2V by the n-th writer step, the detection outcome of the "00" first step write verify operation is satisfactory so that the data in the data storage sections DS2 are shifted to "1"s. The data storage sections DS2 storing "1"s are made to keep on storing "1"s. The combinations of 0/0/1, 0/1/1 and 1/1/1 do not constitute any objects of the first step; very operation so that they are not changed.

Table 7 shows the relationship between the data of the data storage sections DS1, DS2 and DS3 before and after the "00" second step write verify operation and the threshold value (Vt) of the corresponding memory cells of the write algorithm illustrated in FIG. 13.

TABLE 7

|  | DS1/DS2/DS3 data | DS1/DS2/DS3 after n-th "00" second step write verify Memory cell threshold value Vt | |
| --- | --- | --- | --- |
|  |  | When lower than 2.4 V | When higher than 2.4 V |
| DS1/DS2/DS3 data | 0/0/1 | 0/0/1 | — |
| DS1/DS2/D3 before | 0/1/1 | 0/1/1 | — |
| n-th "00" second | 1/1/1 | 1/1/1 | — |
| step write verify | 0/0/0 | 0/0/0 | — |
|  | 0/1/0 | 0/1/0 | 0/1/0 |
|  | 1/1/0 | 1/1/0 | 1/1/0 |

Immediately before the n-th "00" second step write verify operation, the data of the data storage sections DS1, DS2 and DS3 are one of the combinations of 0/0/1, 0/1/1, 1/1/1, 0/0/0, 0/1/0 and 1/1/0. The combination of 0/0/0 indicates that the threshold value of the memory cells has not got to the "00" first step write verify voltage after the n-th write step. The combination of 0/1/0 indicates that the threshold value of the memory cells has got to the "00" first step write verify voltage by the n-th write step but not to the "00" second step write verify voltage by the n−1-th write step. The combination of 1/1/0 indicates that the threshold value of the memory cells has got to the "00" second step write verify voltage by the n−1-th write step. It is not possible that the threshold value of the memory cells has got to the "00 second step write verify voltage by the n−1-th write step but not to the "00 first step write verify voltage by the n-th write step so that the combination of 1/0/0 does not exists in this embodiment.

If the threshold value of the memory cells has not got to 2.4V which is the "00" second step write verify voltage by the n-th write step, the detection outcome of the "00" second step write verify operation is not satisfactory so that the data in the data storage sections DS1 are not changed. If, on the other hand, the threshold value of the memory cells has got to 2.4V, the detection outcome of the "00" second step write verify operation is satisfactory so that the data in the data storage sections DS1 are shifted to "1"s. The data storage sections DS1 storing "1"s are made to keep on storing "1"s. The combination of 0/0/0 will not be changed by the "00" second write verify operation. The combinations of 0/0/1, 0/1/1 and 1/1/1 do not constitute any objects of the first step; very operation so that they are not changed.

Figure 14:
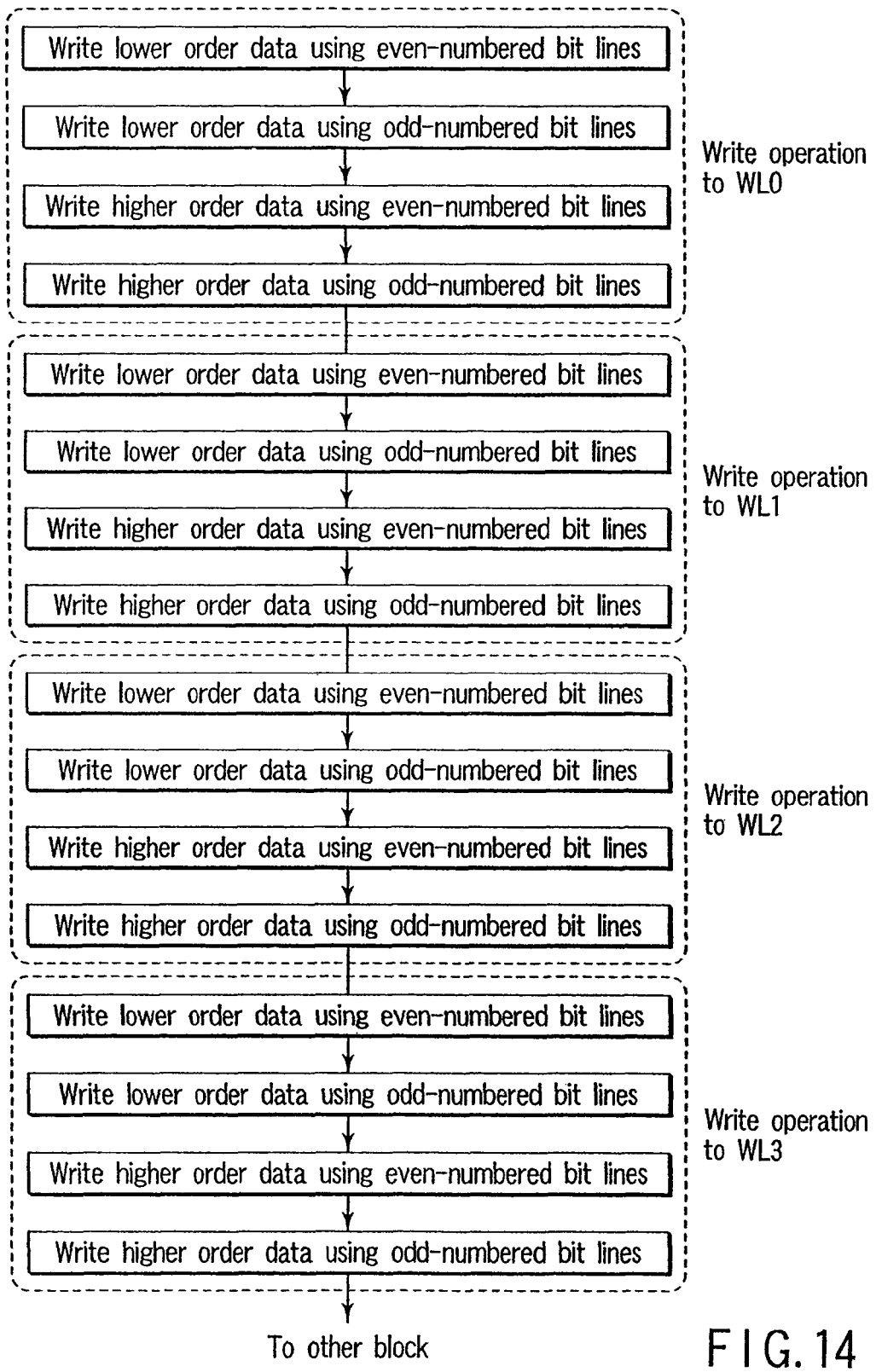
FIG. 14 is a flow chart schematically illustrating the control algorithm of the first embodiment of flash memory according to the invention for controlling the order of writing data into the blocks.

FIG. 14 is a flow chart schematically illustrating the control algorithm of the first embodiment of flash memory according to the invention for controlling the order of writing data into the blocks.

Firstly, the word line WL0 is selected and lower order data are written into a page constituted by a plurality of memory cells connected to even-numbered bit lines. Secondly, lower order data are written into a page constituted by a plurality of memory cells connected to odd-numbered bit lines. Thirdly, higher order data are written into a page constituted by a plurality of memory cells connected to even-numbered bit lines. Finally, higher order data are written into a page constituted by a plurality of memory cells connected to odd-numbered bit lines. Then, data are written in a similar manner by sequentially using the remaining word lines WL1, WL2, WL3, . . . , observing the above sequence.

With this arrangement, the interference of the floating gates of adjacent memory cells can be minimized. In other words, if a memory cell where a data is written subsequently shifts its state from "11" to "10", from "11" to "01" or from "10" to "00", a shift from "11" to "00" never takes place. The shift from "11" to "00" raises the threshold value of adjacent memory cells most.

Figure 15:
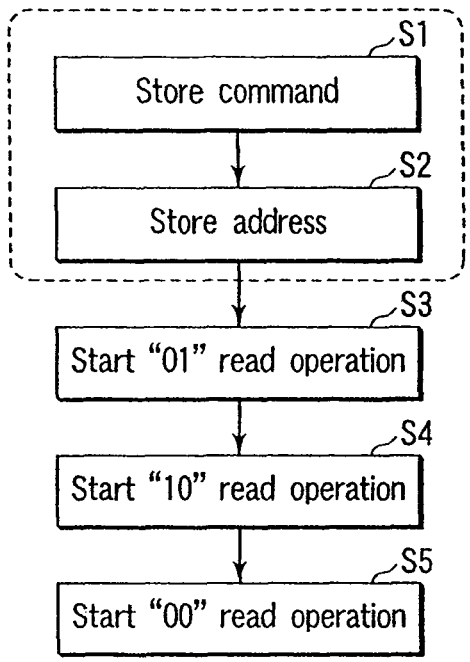
FIG. 15 is a flow chart schematically illustrating the control algorithm of the first embodiment of flash memory according to the invention when reading the lower order page data stored in a memory cell.

FIG. 15 is a flow chart schematically illustrating the control algorithm of the first embodiment of flash memory according to the invention when reading the lower order page data stored in a memory cell.

The control operation starts with receiving a read command from the host and placing the read command in the state machine 8 (S1). Then, the operation proceeds to receiving an address data from the host and placing the address in the state machine 8 to select the page to be used for a read operation (S2). As a result of the addressing, the operation of Steps S3 through S5 is automatically started by the state machine 8 in the inside.

Firstly, a "01" read operation is started (S3). A voltage of 1V is supplied to the word line WL for the "01" read operation. "1" is produced by the reading operation of the sense amplifier if the threshold value of the memory cell is lower than the "01" data, whereas "0" is produced if the threshold value of the memory cell is higher than "01" data. The outcome of the read operation is stored in the corresponding data storage section DS3. Thereafter, a "10" read operation is started (S4). A voltage of 0V is supplied to the word line WL for the "10" read operation. "1" is produced by the reading operation of the sense amplifier if the threshold value of the memory cell is lower than the "10" data, whereas "0" is produced if the threshold value of the memory cell is higher than "10" data. The outcome of the read operation is stored in the corresponding data storage section DS2. Lastly, a "00" read operation is started (S5). A voltage of 2V is supplied to the word line WL for the "00" read operation. "1" is produced by the reading operation of the sense amplifier if the threshold value of the memory cell is lower than the "00" data, whereas "0" is produced if the threshold value of the memory cell is higher than "00" data. The lower order page data is produced by a logical operation using the outcome of the "00" read operation and the data stored in the corresponding data storage sections DS2 and DS3 and stored in the corresponding data storage section DS1. The data stored in the data storage section DS1 is output as lower order page data.

For example, if the outcome of the operation of reading "01" stored in the data storage section DS3 is "1" and that of the operation of reading "10" stored in the data storage section DS2 is also "1", "1" is produced by the logical operation using the lower order page data. If the outcome of the operation of reading "01" stored in the data storage section DS3 is "1" and that of the operation of reading "10" stored in the data storage section DS2 is "0", "0" is produced by the logical operation using the lower order page data. If the outcome of the operation of reading "01" stored in the data storage section DS3 is "0" and that of the operation of reading "00" is also "0", "0" is produced by the logical operation using the lower order page data. The outcome of the operation of reading "01" stored in the data storage section DS3 is "0" and that of the operation of reading "00" is "1", "1" is produced by the logical operation using the lower order page data.

In short, the logic circuit for carrying out such logical operations needs to be so arranged that the value of the DS2 is stored in the data storage section DS1 as lower order page data when DS3 is "1" and the outcome of reading "01" is stored in the data storage section DS1 as lower order page data when DS3 is "0".

Figure 16:
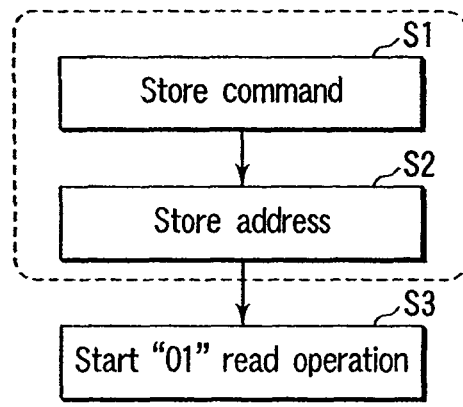
FIG. 16 is a flow chart schematically illustrating the control algorithm of the first embodiment of flash memory according to the invention when reading the higher order page data stored in a memory cell.

FIG. 16 is a flow chart schematically illustrating the control algorithm of the first embodiment of flash memory according to the invention when reading the higher order page data stored in a memory cell.

The control operation starts with receiving a read command from the host and placing the read command in the state machine 8 (S1). Then, the operation proceeds to receiving an address data from the host and placing the address in the state machine 8 to select the page to be used for a read operation (S2). As a result of the addressing, the operation of Step S3 is automatically started by the state machine 8 in the inside.

Firstly, a "01" read operation is started in Step S3. The outcome of the reading operation shows upper order page data, which is stored in the corresponding data storage section DS1. In other words, the outcome of the operation of reading "01" is used as upper order page data. Then, the data in the data storage section DS1 is externally output.

In this way, with the multi-value flash memory of the first embodiment, it is now possible to suppress any undesired increase of write time and reduce the distribution width of a threshold value so as to improve the reliability of the device.

Now, the second embodiment of the invention will be described below.

Figure 17A:
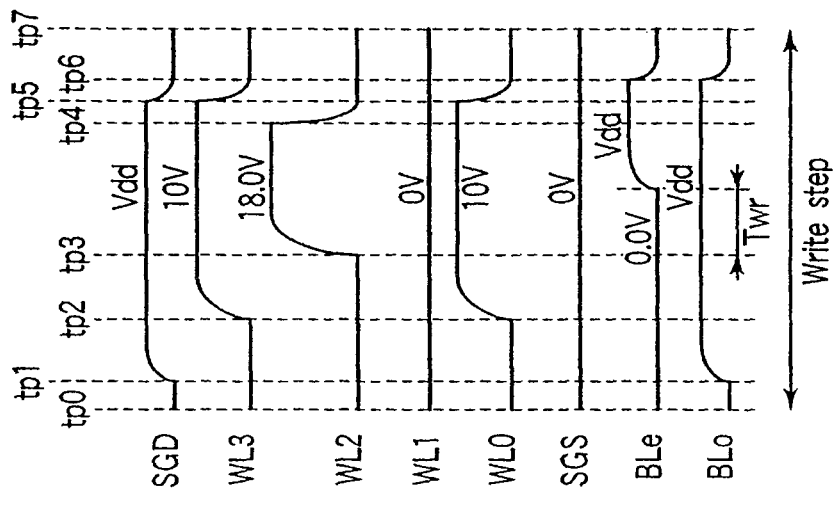
FIG. 17A is a graph illustrating the signal waveforms in a write step of the first embodiment of flash memory according to the invention.

FIG. 17A is a graph illustrating the signal waveforms in a write step of the first embodiment of flash memory according to the invention as extracted from the signal waveform of FIG. 11. Note that the voltage of the bit lines BLe is made equal to 0.4V to carry out a second step write operation. In a write step of the first embodiment, the write operation is conducted while the voltage of the bit lines BL that is the write control voltage is typically held to 0.4V during all the period of applying a predetermined write voltage (e.g., 18.0V as shown in FIG. 17A) to the selected word line WL.

Figure 17B:
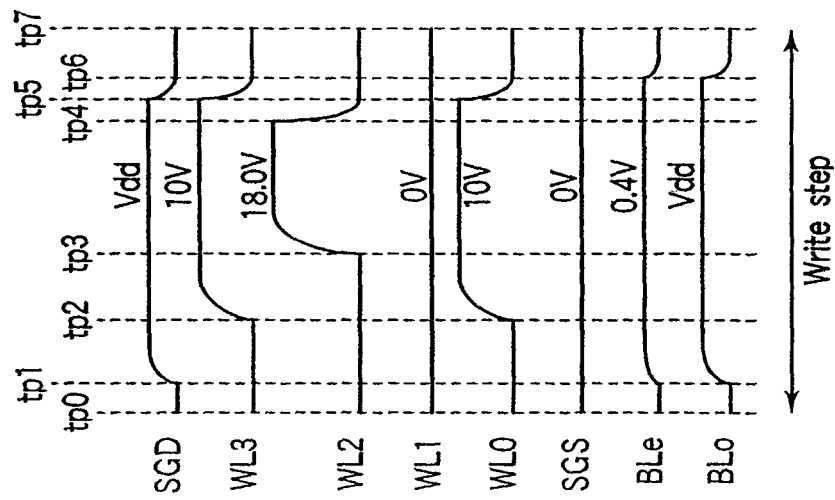
FIG. 17B is a graph illustrating the signal waveforms in a write step of the second embodiment of flash memory according to the invention.

FIG. 17B is a graph illustrating the signal waveforms in a write step of the second embodiment of flash memory according to the invention. As shown in FIG. 17B, the voltage of the bit lines BL that is the write control voltage is held to 0V for only a predetermined period Twr out of all the period of applying the write voltage Vpgm to the selected word line WL and subsequently brought to Vdd in order to inhibit any write operation thereafter.

The predetermined period Twr for which the voltage of the bit lines BL is held to 0V is determined in such a way that the duration of the second step write operation is shorter that of the first step write operation. Then, the increment of the threshold value for the second step write operation can be made smaller than that of the threshold vale for the first step write operation as in the case of the first embodiment.

Thus, with the second embodiment, the effective value of the write control voltage can be made substantially equal to that of the first embodiment where the voltage of the bit lines BL that is the write control voltage is held to a constant level during the entire write step to consequently bring about the advantages of the first embodiment.

Now, the third embodiment of the invention will be described below.

FIG. 18 is a graph illustrating the signal waveforms of different parts of the third embodiment of flash memory according to the invention when writing a data into a single memory cell. It will be appreciated that FIG. 18 corresponds to the waveforms of FIG. 11.

As described above by referring to FIG. 11, with the first embodiment, the voltage of the bit lines is reset to 0V after the end of a first step write verify operation even when it maintains the voltage level observed immediately after a charging operation and then the bit lines are electrically recharged for a second step write verify operation.

On the other hand, with the third embodiment a write verify operation is conducted in a manner as described below.

The bit lines BLe are electrically charged typically to 0.7V for a first step write verify operation. As the selected word line WL2 gets to the first step write verify voltage, the bit lines BLe maintain the 0.7V if the threshold value of the memory cell has got to the first step write verify voltage. However, the voltage of the bit lines BLe falls toward 0V if the threshold value of the memory cell has not got to the first step write verify voltage. If the threshold value of the memory cell has got to the first step write verify voltage or not can be detected by observing the voltage of the bit lines BLe by means of a sense amplifier at timing of tfv4 shown in FIG. 18. If the threshold value of the memory cell has got to the write verify voltage, the detecting operation is successfully completed.

Thereafter, at timing of tfv5 of tfv3, the voltage of the selected word line WL2 is switched from the first step write verify voltage to the second step write verify voltage. For example, the voltage of the selected word line WL2 may be raised from 0.2V to 0.4V as shown in FIG. 18. If the threshold value of the memory cell has got to the second step write verify voltage, the 0.7V of the bit lines BLe is maintained. If, on the other hand, the threshold value of the memory cell has not got to the second step write verify voltage, the voltage of the bit lines BLe falls toward 0V. If the threshold value of the memory cell has got to the second step write verify voltage or not can be checked by detecting the voltage of the bit lines BLe at the timing of tsv4. If the threshold value of the memory cell has got to the write verify voltage, the outcome of the detection is satisfactory.

The third embodiment provides an advantage of eliminating the time necessary for charging the bit lines for a second step write verify operation and achieving a higher data writing rate in addition to the advantages of the first embodiment. It will be appreciated that the above description applies to a first or second step write verify operation with data "01" or data "00" by changing the write verify voltage.

While the above embodiments are described in terms of storing a 2-bit data, or a 4-valued data, in a single memory cell, it will be appreciated that embodiments adapted to store a higher valued data in a single memory can easily be realized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A non-volatile semiconductor memory device comprising:
   a plurality of electrically data rewritable non-volatile semiconductor memory cells;
   a memory cell array in which the memory cells or memory cell units are arranged in matrix, the memory cell unit including at least one of the memory cells;
   a word line connected to a portion of the memory cells;
   a write circuit configured to perform a write step operation for a selected memory cell included in the memory cells, a write voltage being applied to the word line connected to the selected memory cell in the write step operation; and
   a write verify circuit configured to perform a write verify operation for the selected memory cell, a write verify voltage being applied to the word line connected to the selected memory cell in the write verify operation;
   wherein more than one bit data is capable of being written into the memory cell and being stored in the memory cell;
   wherein when a first data is written into a first selected memory cell and a second data is written into a second selected memory cell, at least one write step operation and at least one write verify operation are repeated before completion of writing the first data and the second data into the first selected memory cell and the second selected memory cell respectively;
   wherein a first step and a second step of a first write verify operation are performed for the first selected memory cell between (n-th) write step operation and (n+1-th) write step operation (n is a natural number), the second step of the first write verify operation is performed after the first step of the first write verify operation, a first write verify voltage and a second write verify voltage are respectively applied to the word line connected to the first selected memory cell in the first step and the second step of the first write verify operation;
   wherein a first step and a second step of a second write verify operation are performed for the second selected memory cell between (k-th) write step operation and (k+1-th) write step operation (k is a natural number), the second step of the second write verify operation is performed after the first step of the second write verify operation, a third write verify voltage and a fourth write verify voltage are respectively applied to the word line connected to the second selected memory cell in the first step and the second step of the second write verify operation; and
   wherein the second write verify voltage is lower than the third write verify voltage, a difference between the second write verify voltage and the third write verify voltage is larger than a difference between the first write verify voltage and the second write verify voltage, and the first data is different from the second data.

2. The non-volatile semiconductor memory device according to claim 1, wherein the first write verify voltage is lower than the second write verify voltage, and the third write verify voltage is lower than the fourth write verify voltage.

3. The non-volatile semiconductor memory device according to claim 1, wherein k is larger than n.

4. The non-volatile semiconductor memory device according to claim 3, wherein the first write verify voltage is lower than the second write verify voltage, and the third write verify voltage is lower than the fourth write verify voltage.

5. The non-volatile semiconductor memory device according to claim 1, wherein a difference between the second write verify voltage and the third write verify voltage is larger than a difference between the third write verify voltage and the fourth write verify voltage.

6. The non-volatile semiconductor memory device according to claim 1, wherein the write voltage is higher than power supply voltage.

7. The non-volatile semiconductor memory device according to claim 1, wherein a first write voltage is applied to the word line connected to the selected memory cell in the (n-th) write step operation, a second write voltage is applied to the word line connected to the selected memory cell in the (n+1-th) write step operation, both the first and second write voltage are higher than power supply voltage, and the second write voltage is higher than the first write voltage.

8. The non-volatile semiconductor memory device according to claim 1, wherein the write voltage is higher than power supply voltage, the write voltage increases with a stepwise increment of predetermined voltage as the write step operation is repeated.

9. The non-volatile semiconductor memory device according to claim 1, wherein the first step and the second step of the second write verify operation are performed between the (n-th) write step operation and the (n+1-th) write step operation.

10. The non-volatile semiconductor memory device according to claim 1, wherein the write voltage is higher than power supply voltage, and the write voltage is applied to the word line connected to both the first selected memory cell and the second selected memory cell simultaneously in the (n-th) write step operation.

11. The non-volatile semiconductor memory device according to claim 1, wherein an operation of writing the first data into the first selected memory cell and an operation of writing the second data into the second selected memory cell are simultaneously performed.

12. The non-volatile semiconductor memory device according to claim 1, wherein in the memory cell array, the memory cell units are arranged in matrix, the memory cell unit includes plurality of the memory cells connected in series, a first selection gate and a second selection gate, and the plurality of the memory cells connected in series are connected between the first selection gate and the second selection gate.

13. The non-volatile semiconductor memory device according to claim 12, further comprising:
a bit line; and
a source line;
wherein the first selection gate is connected to the bit line, and the second selection gate is connected to the source line.

14. The non-volatile semiconductor memory device according to claim 1, wherein at least two bit data is capable of being written into the memory cell and being stored in the memory cell.

15. The non-volatile semiconductor memory device according to claim 1, wherein when the first data, the second data and a third data are respectively written into the first selected memory cell, the second selected memory cell and a third selected memory cell, a third write verify operation is performed for the third selected memory cell between (m-th) write step operation and (m+1-th) write step operation (m is a natural number), a fifth write verify voltage is applied to the word line connected to the third selected memory cell in the third write verify operation, and the third data is different from any of the first data and the second data.

16. The non-volatile semiconductor memory device according to claim 15, wherein the fifth write verify voltage is higher than the fourth write verify voltage, and a difference between the fourth write verify voltage and the fifth write verify voltage is larger than a difference between the first write verify voltage and the second write verify voltage.

17. The non-volatile semiconductor memory device according to claim 15, wherein the fourth write verify voltage is lower than the fifth write verify voltage, and a difference between the fourth write verify voltage and the fifth write verify voltage is larger than a difference between the third write verify voltage and the fourth write verify voltage.

18. The non-volatile semiconductor memory device according to claim 15, wherein the third write verify operation is performed for the third selected memory cell between (k-th) write step operation and (k+1-th) write step operation, and the fifth write verify voltage is higher than the fourth write verify voltage.

19. The non-volatile semiconductor memory device according to claim 18, wherein the first step and the second step of the second write verify operation are performed between the (n-th) write step operation and the (n+1-th) write step operation, the third write verify operation is performed for the third selected memory cell between (n-th) write step operation and (n+1-th) write step operation, and the fifth write verify voltage is higher than the fourth write verify voltage.

20. The non-volatile semiconductor memory device according to claim 15, wherein the write voltage is higher than power supply voltage, and the write voltage is applied to the word line connected to the first selected memory cell, the second selected memory cell and the third selected memory cell simultaneously in the (n-th) write step operation.

21. The non-volatile semiconductor memory device according to claim 15, wherein an operation of writing the first data into the first selected memory cell, an operation of writing the second data into the second selected memory cell, and an operation of writing the third data into the third selected memory cell are simultaneously performed.

22. The non-volatile semiconductor memory device according to claim 15, wherein the first write verify voltage is lower than the second write verify voltage, the third write verify voltage is lower than the fourth write verify voltage, and the fifth write verify voltage is higher than the fourth write verify voltage.

23. The non-volatile semiconductor memory device according to claim 15, wherein m is larger than k, and k is larger than n, and the fifth write verify voltage is higher than the fourth write verify voltage.

24. The non-volatile semiconductor memory device according to claim 23, wherein the first write verify voltage is lower than the second write verify voltage, and the third write verify voltage is lower than the fourth write verify voltage.

25. The non-volatile semiconductor memory device according to claim 1, wherein when the first data, the second data and a third data are respectively written into the first selected memory cell, the second selected memory cell and a third selected memory cell, first step and second step of third write verify operation are performed for the third selected memory cell between (m-th) write step operation and (m+1-th) write step operation (m is a natural number), the second step of the third write verify operation is performed after the first step of the third write verify operation, a fifth write verify voltage and a sixth write verify voltage are respectively applied to the word line connected to the third selected memory cell in the first step and the second step of the third write verify operation, and the third data is different from any of the first data and the second data.

26. The non-volatile semiconductor memory device according to claim 25, wherein the fourth write verify voltage is lower than the fifth write verify voltage, and a difference between the fourth write verify voltage and the fifth write verify voltage is larger than a difference between the first write verify voltage and the second write verify voltage.

27. The non-volatile semiconductor memory device according to claim 25, wherein the fourth write verify voltage is lower than the fifth write verify voltage, and a difference between the fourth write verify voltage and the fifth write verify voltage is larger than a difference between the third write verify voltage and the fourth write verify voltage.

28. The non-volatile semiconductor memory device according to claim 26, wherein the fourth write verify voltage is lower than the fifth write verify voltage, and a difference between the fourth write verify voltage and the fifth write verify voltage is larger than a difference between the fifth write verify voltage and the sixth write verify voltage.

* * * * *